United States Patent [19]
Morimoto

[11] Patent Number: 5,912,482
[45] Date of Patent: Jun. 15, 1999

[54] SOLID-STATE IMAGE PICKUP DEVICE CAPABLE OF REDUCING FIXED PATTERN NOISE AND PREVENTING SMEAR

[75] Inventor: Michihiro Morimoto, Tokyo, Japan

[73] Assignee: NEC Corporation, Tokyo, Japan

[21] Appl. No.: 08/915,275

[22] Filed: Aug. 20, 1997

[30] Foreign Application Priority Data

Aug. 22, 1996 [JP] Japan ........................... 8-241126

[51] Int. Cl.⁶ ..................... H01L 27/148; H01L 29/768
[52] U.S. Cl. ..................... 257/232; 257/233; 257/241; 257/249; 257/250
[58] Field of Search ........................ 257/232, 233, 257/241, 249, 250

[56] References Cited

U.S. PATENT DOCUMENTS 5,393,997  2/1995  Fukusho et al. ................. 257/232
5,399,888  3/1995  Nakashiba ........................ 257/233

*Primary Examiner*—Ngân V. Ngô
*Attorney, Agent, or Firm*—Hayes, Soloway, Hennessey, Grossman & Hage, P.C.

[57] ABSTRACT

In a solid-state image pickup device having photoelectric converting sections, vertical charge transfer sections, and a horizontal charge transfer section, the vertical charge transfer sections include first, second, and third vertical charge transfer electrodes The third (final) vertical charge transfer electrode, which is adjacent to the horizontal charge transfer section, is electrically connected to a shunt wire (a first shading film) via lining contacts. A second shading film is formed electrically separated from the shunt wire, for light-shielding areas between photoelectric converting sections in a vertical direction.

13 Claims, 15 Drawing Sheets

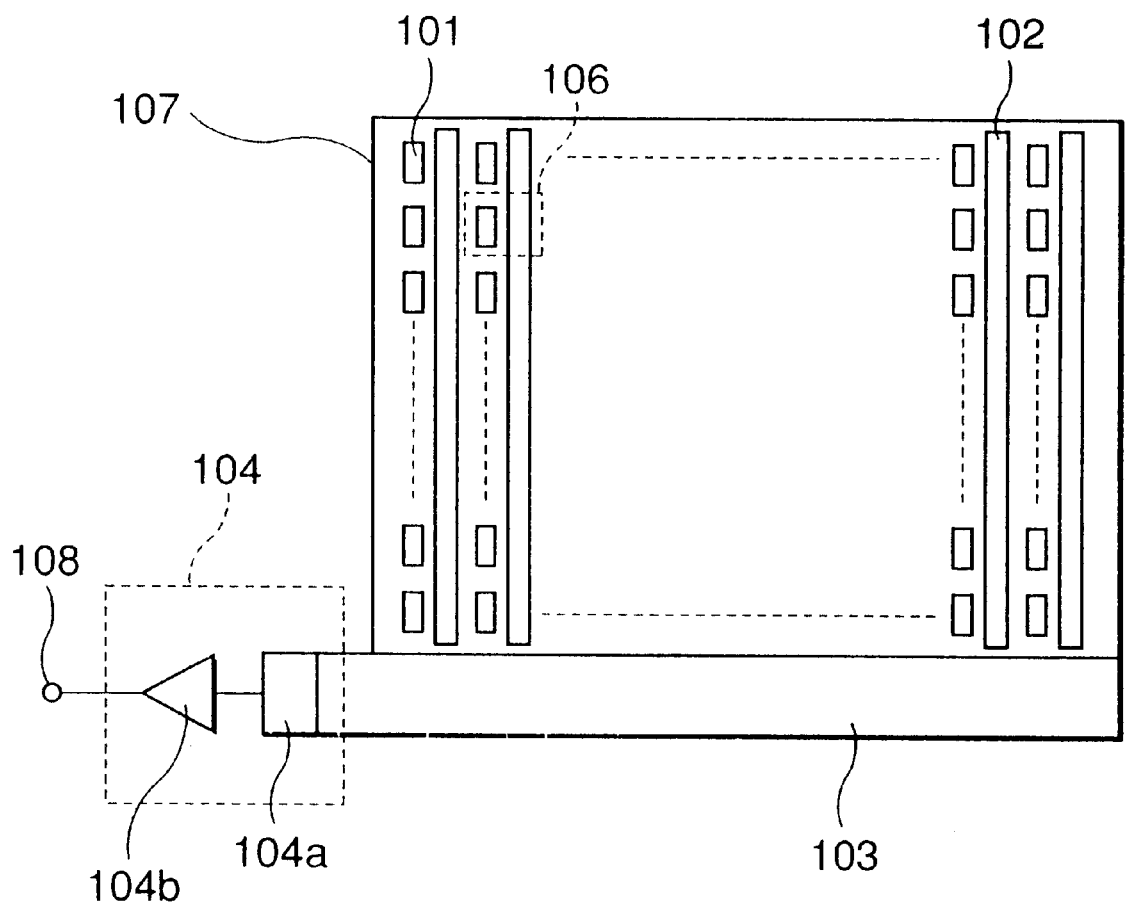
FIG.1 [PRIOR ART]

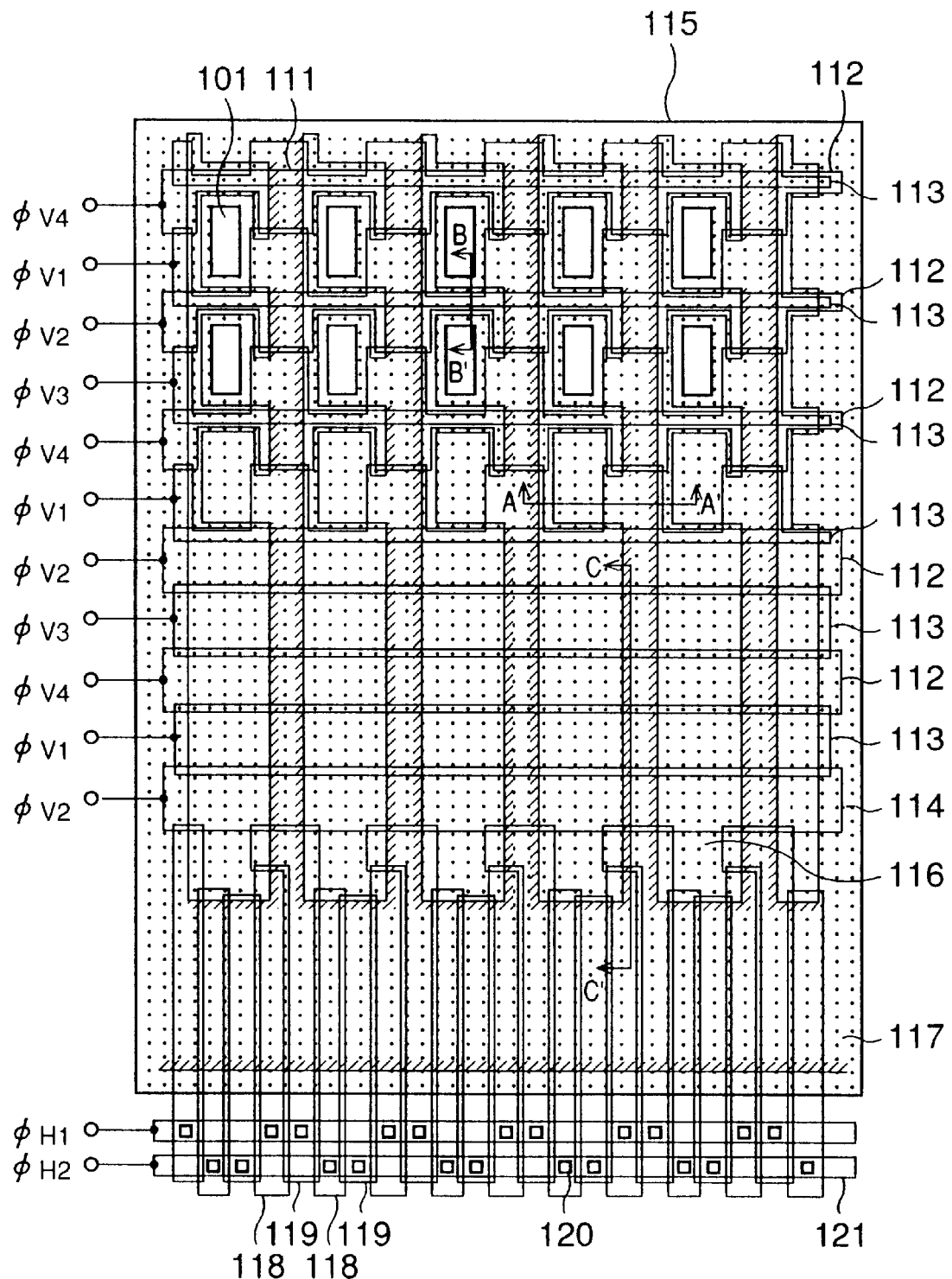
FIG.2 [PRIOR ART]

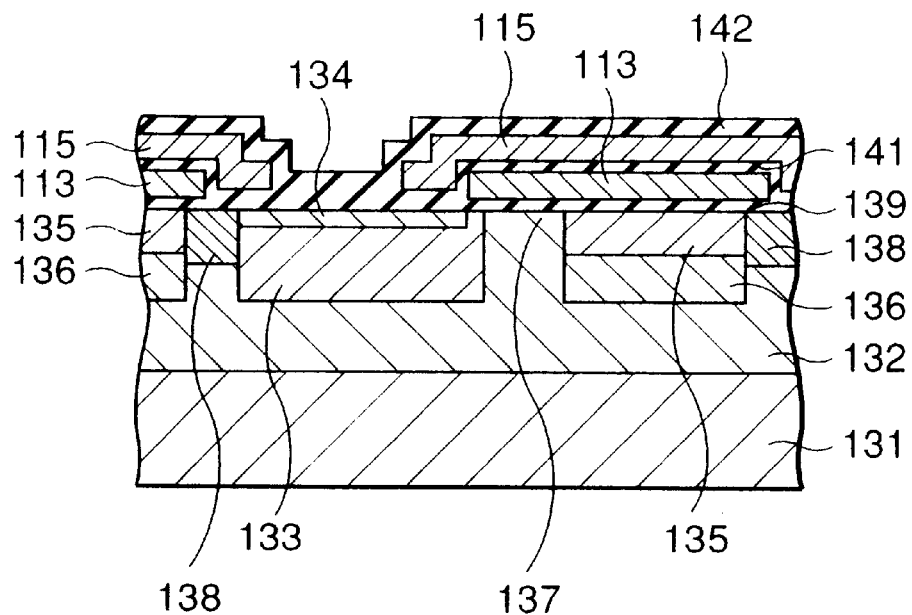
FIG.3A [PRIOR ART]
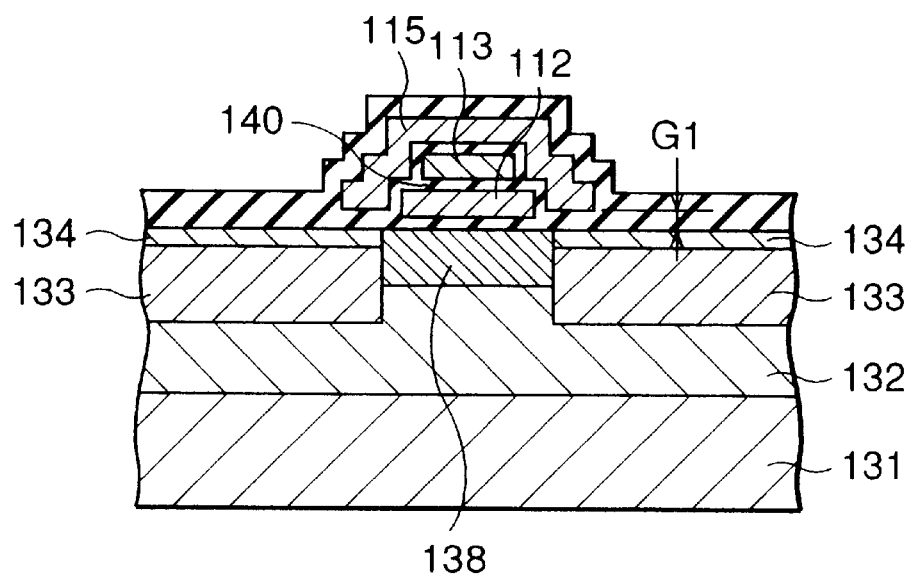
FIG.3B [PRIOR ART]

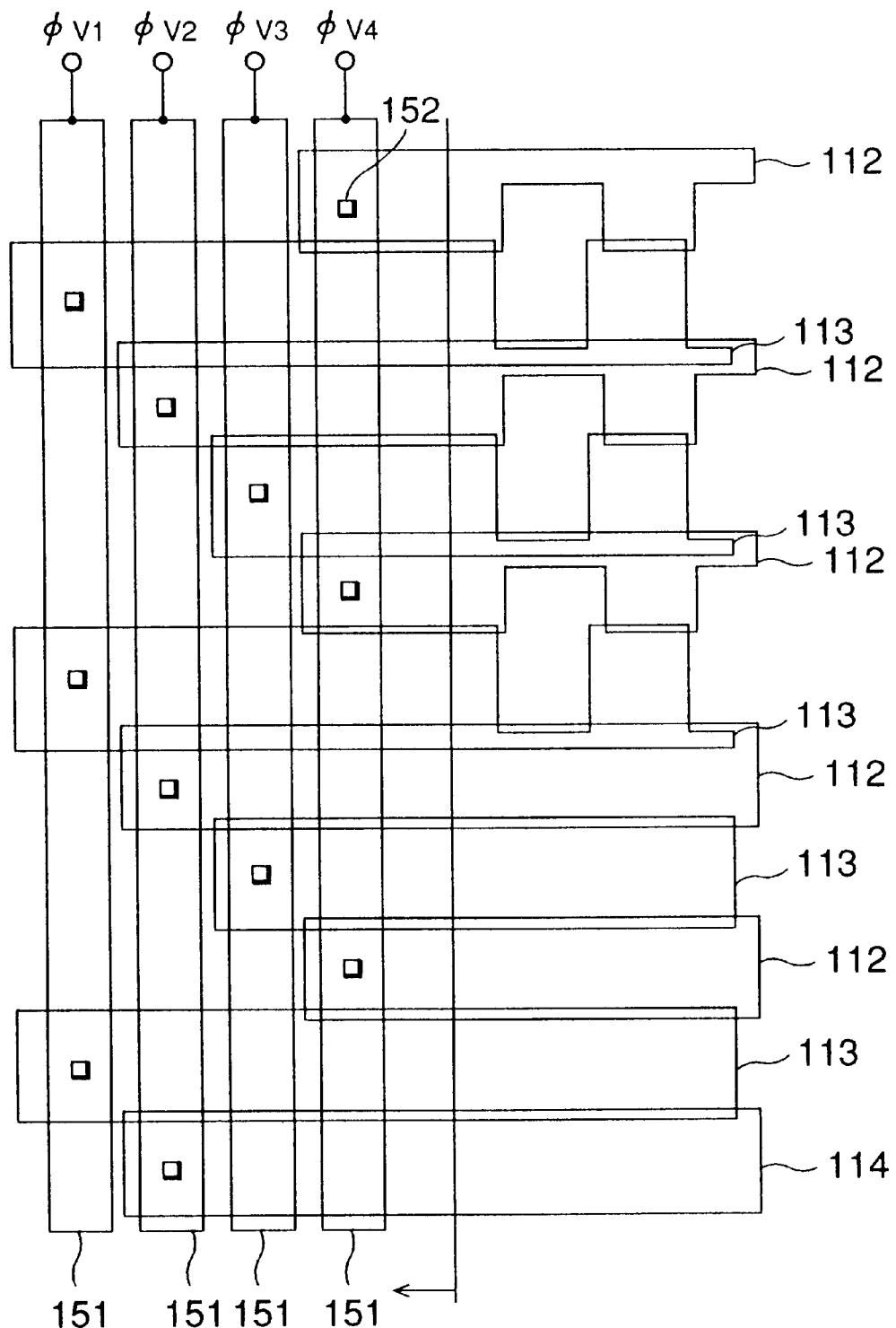
FIG.4 [PRIOR ART]

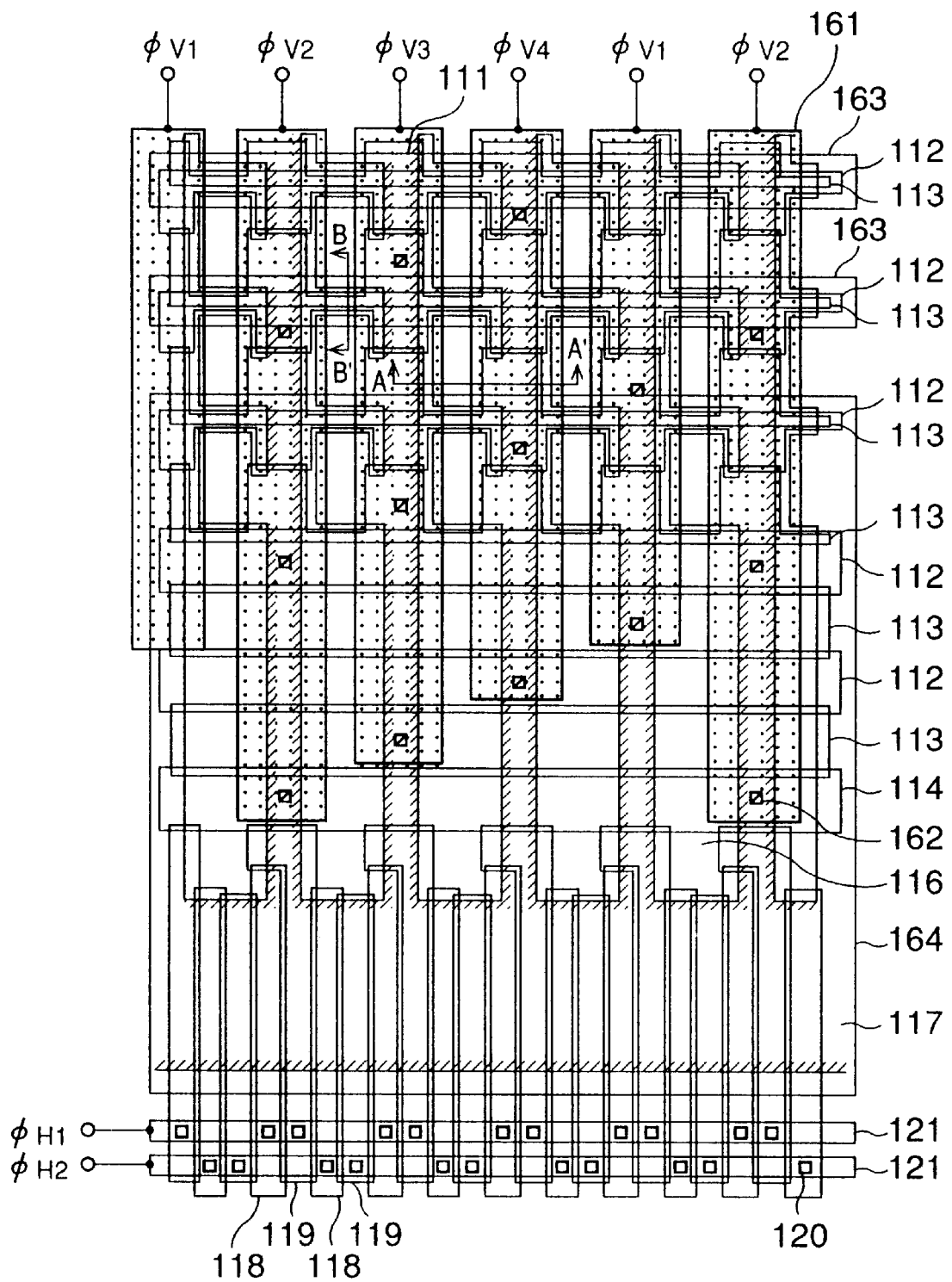
FIG.5 [PRIOR ART]

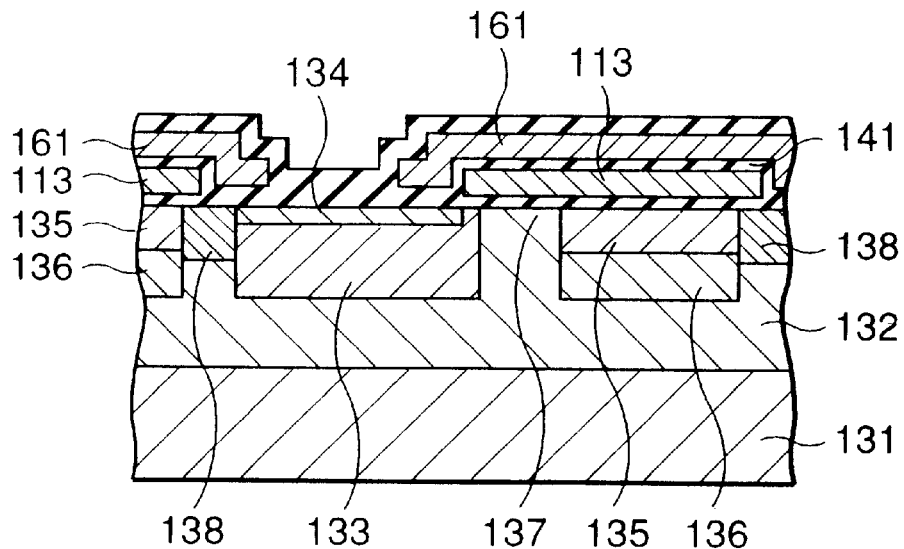
FIG.6A [PRIOR ART]
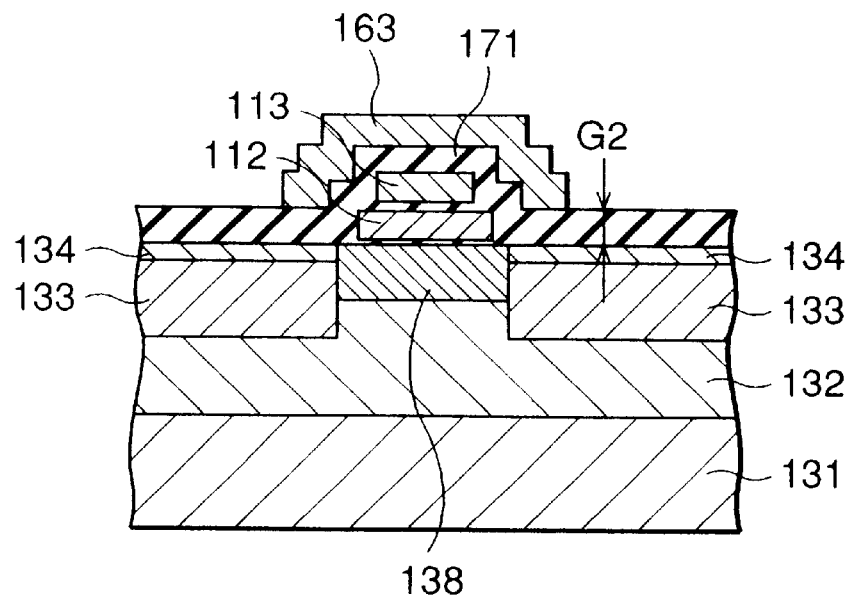
FIG.6B [PRIOR ART]

SOLID-STATE IMAGE PICKUP DEVICE CAPABLE OF REDUCING FIXED PATTERN NOISE AND PREVENTING SMEAR

BACKGROUND OF THE INVENTION

This invention relates to a solid-state image pickup device for use in picking up image and, more particularly, to a CCD solid-state image pickup device of interline transfer (ILT) type.

A conventional solid-state image pickup device comprises a plurality of photoelectric converting sections, arranged in the configuration of a matrix with m rows and n columns where m and n represent first and second positive integers each of which is not less than two, n vertical charge transfer sections adjacent to the n columns of the photoelectric converting sections at one side thereof, each of the n vertical charge transfer sections extending along a vertical direction, a horizontal charge transfer section connected to one ends of said n vertical charge transfer sections and extending along the horizontal direction, a shading film for shading first areas between the photoelectric converting sections adjacent in a horizontal direction to each other or second areas between the photoelectric converting sections adjacent in a vertical direction to each other.

The photoelectric converting sections accumulate, in response to incident light, electric charges as signal charges. The n vertical charge transfer sections are for reading the signal charges out of the photoelectric converting sections as read charges to transfer the read charges along the vertical direction as vertical transferred charges. Each of the n vertical charge transfer sections includes m clusters of vertical charge transfer electrodes alternately arranged along the vertical direction and a vertical charge transfer region formed beneath the m clusters of vertical charge transfer electrodes The horizontal charge transfer section receives the vertical transferred charges from the n vertical charge transfer sections horizontal line by horizontal line as received charges to transfer the received charges along the horizontal direction as horizontal transferred charges. The device further comprises an output circuit section which is connected to an end of the horizontal charge transfer section. The output circuit section receives the horizontal transferred charges to convert the horizontal transferred charges into a voltage signal. Those components are isolated from one another by a plurality of element isolation sections.

In one example of the conventional solid-state image pickup device, the n vertical charge transfer sections have a plurality of first, second, third vertical charge transfer electrodes and charge transfer channels. Above the channels of the n vertical charge transfer sections, a plurality of the first and the second vertical charge transfer electrodes are formed to extend in the horizontal direction of an image pickup region. The third vertical charge transfer electrode is also formed to extend in the horizontal direction of the image pickup region, adjacent to the horizontal charge transfer section. Accordingly, the third vertical charge transfer electrode can also be called, "the final vertical charge transfer electrode". Except for each opened area above each of the photoelectric converting sections, a shading film is formed on the image pickup region and the horizontal charge transfer section. An end of the channel of each of the n vertical charge transfer sections is connected to a channel of the horizontal charge transfer section. Above the channel of the horizontal charge transfer section, a plurality of primary and secondary horizontal charge transfer electrodes are formed. Each of the primary and the secondary horizontal charge transfer electrodes extends over an area where a thick $SiO_2$ film is formed (Hereinunder, called a field area) to be connected to a horizontal bus line through a contact hole.

In the first conventional solid-state image pickup device mentioned above, the vertical charge transfer pulses are supplied from both ends of the image pickup region to the first, the second, and the third (final) vertical charge transfer electrodes. As a result, bluntness of waveform of the vertical charge transfer pulses is caused to occur in a central portion of the image pickup region due to resistance and capacitance of the first, the second, and the third (final) vertical charge transfer electrodes. This brings about deterioration of such a vertical charge transfer efficiency. The problem is serious when the solid-state image pickup device has a large effective picture elements area in size, for example, an optical size of one inch.

In order to overcome this problem, proposal has been made by Unexamined Japanese patent publication 216672/1992. In this paper, a method of preventing the aforesaid bluntness of waveform of the pulses is disclosed. In this method, charge transfer pulses are supplied to vertical charge transfer electrodes by metal wires formed along each vertical charge transfer section and thereabove.

In the second conventional solid-state image pickup device, the first, the second, and the third (final) vertical charge transfer electrodes are connected, through lining contacts, respectively, to power feeding wires each of which extends in a vertical direction along each vertical charge transfer section. The power feeding wires are made of tungsten, aluminum, or the like, and serve as first shading films for the n vertical charge transfer sections. The power feeding wires are isolated from each other between picture elements adjacent in a horizontal direction. As a result, the power feeding wires are not capable of shading areas (Hereinunder, called ferry portions) between the photoelectric converting sections adjacent in a vertical direction to each other. Accordingly, it is inevitably caused to occur that smear is increased. In order to shade the ferry portions, second shading films are formed in a horizontal direction in addition to the power feeding wires serving as the aforesaid first shading films. Furthermore, a third shading film made of aluminum, and the like, is formed over the areas from the horizontal charge transfer section to the photoelectric converting sections.

In the interim, when deterioration is caused to occur in charge transfer efficiency from the vertical charge transfer sections to the horizontal charge transfer section, a fixed pattern noise is generated in a regenerated image. The fixed pattern noise is observed as a fixed pattern like a black line extending in a vertical direction in the regenerated image, which makes quality of image be quite deteriorated.

In the second conventional solid-state image pickup device, like the first and the second vertical charge transfer electrodes, the third (final) vertical charge transfer electrode is also connected to one of the power feeding wires through the lining contact. As a result, bluntness of waveform of the vertical charge transfer pulses is small in size, if caused to occur, in a central portion of the image pickup region. Accordingly, compared with the first conventional solid-state image pickup device, vertical charge transfer efficiency is improved to prevent the fixed pattern noise from being generated.

It is a recent trend that solid-state image pickup devices have relatively small optical size of, for example, one-third inch or one-fourth inch. In case that such a solid-state image pickup device is designed to have, for example, four hundreds thousands effective picture elements, the picture element is forced to have 5×5 through 8×8 micron meters in size. When the picture element has such a small size, smear characteristic becomes serious as one of main characteristics of a solid-state image pickup device. The smear characteristic degrades because spurious signal charges flowing the vertical charge transfer sections increase. The smear is observed as a noise like a white line in a regenerated image.

One of the reasons of the smear is that incident light enters through chink between a shading film and a surface of a substrate. Namely, the incident light reaches the channels of the vertical charge transfer sections and be subjected to photoelectric conversion therein. The photoelectric conversion is caused to occur due to multi-reflection between the surface of the substrate and the shading film or the vertical charge transfer electrode.

In the second conventional solid-state image pickup device, the second shading films are formed on the above-mentioned ferry portions to improve the smear characteristic More incident light enters into the vertical charge transfer sections through the ferry portions in the second conventional solid-state image pickup device than in the first conventional solid-state image pickup device. The reason is that a distance between the second shading films and the surface of the substrate in the second conventional solid-state image pickup device is larger than another distance between the shading film and the surface of the substrate in the first conventional solid-state image pickup device. This is further because an insulation film exists between the power feeding wires and the second shading films in the second conventional solid-state image pickup device.

Thus, the second conventional solid-state image pickup device has a problem that the smear characteristic is not sufficiently improved.

In order to improve the smear characteristic sufficiently, it can be considered that a distance between adjacent power feeding wires are designed to a narrow one, such as 0.1 through 0.2 micron meters only above the ferry portions. Patterning of such power feeding wires requires a high-technology, such as direct electron beam lithography of photo resist. Introduction of such a new process technique brings about some disadvantages, such as changes of manufacturing process, increase of manufacturing cost, and the like. Further, leavings of etching are easily produced in the ferry portions, because the ferry portions have large steps due to overlapping of the vertical charge transfer electrodes. It is therefore difficult that the adjacent power feeding wires are formed to have a narrow distance, such as 0.1 through 0.2 micron meters only over the ferry portions.

On the other hand, in the first conventional solid-state image pickup device, it can be considered that the vertical charge transfer pulses are supplied through an independent terminal only to the third (final) vertical charge transfer electrode. Thereby, load against the vertical charge transfer pulses becomes small, bluntness of waveform thereof can be prevented. However, this causes another undesirable problem that one terminal is further required for the independent terminal

SUMMARY OF THE INVENTION

It is therefore an object of this invention to provide a solid-state image pickup device which can prevent a fixed pattern noise from being generated and improve smear characteristic It is another object of this invention to provide a solid-state image pickup device of the type described, which can be manufactured by process technique of a conventional level without need of increase of terminals.

Other objects of this invention will become clear as the description proceeds.

According to an aspect of this invention, a solid-state image pickup device comprises a plurality of photoelectric converting sections, arranged in the configuration of a matrix with m rows and n columns, for accumulating, in response to incident light, electric charges as signal charges where m and n represent first and second positive integers each of which is not less than two; n vertical charge transfer sections adjacent to the n columns of the photoelectric converting sections at one side thereof, each of the n vertical charge transfer sections extending along a vertical direction, the n vertical charge transfer sections being for reading the signal charges out of the photoelectric converting sections as read charges to transfer the read charges along the vertical direction as vertical transferred charges, each of the n vertical charge transfer sections including m−1 clusters of first and second vertical charge transfer electrodes alternately arranged along the vertical direction, a third vertical charge transfer electrode finally positioned in a vertical charge transfer direction, and a vertical charge transfer region formed beneath the m−1 clusters of first and second vertical charge transfer electrodes and the third vertical charge transfer electrode; a horizontal charge transfer section connected to one ends of the n vertical charge transfer sections and extending along the horizontal direction, the horizontal charge transfer section receiving the vertical transferred charges from the n vertical charge transfer sections horizontal line by horizontal line as received charges to transfer the received charges along the horizontal direction as horizontal transferred charges; at least one power feeding wire which is disposed on and electrically connected to at least the third vertical charge transfer electrode adjacent to the horizontal charge transfer section, which supplies clock pulses to at least the third vertical charge transfer electrode, and which serves as a first shading film for shading the third vertical charge transfer electrode from the incident light; a second shading film which is not electrically connected to the one power feeding wire and which shades areas between the photoelectric converting sections adjacent in the vertical direction to each other; and a third shading film which is not electrically connected to the one power feeding wire and which shades areas between the one power feeding wire and the second shading film, between the one power feeding wire and the horizontal charge transfer section, and over the horizontal charge transfer section.

The one power feeding wire may be electrically connected to the third vertical charge transfer electrode via contact hole.

The one power feeding wire and the second shading film may be manufactured in the same manufacturing process as each other.

According to another aspect of this invention, a solid-state image pickup device comprises a plurality of photoelectric converting sections, arranged in the configuration of a matrix with m rows and n columns, for accumulating, in response to incident light, electric charges as signal charges where m and n represent first and second positive integers each of which is not less than two; n vertical charge transfer sections adjacent to the n columns of the photoelectric converting sections at one side thereof, each of the n vertical charge transfer sections extending along a vertical direction, the n vertical charge transfer sections being for reading the signal charges out of the photoelectric converting sections as read charges to transfer the read charges along the vertical direction as vertical transferred charges, each of the n vertical charge transfer sections including m−1 clusters of first and second vertical charge transfer electrodes alternately arranged along the vertical direction, a third vertical charge transfer electrode finally positioned in a vertical charge transfer direction, and a vertical charge transfer region formed beneath the m−1 clusters of first and second vertical charge transfer electrodes and the third vertical charge transfer electrode; a horizontal charge transfer section connected to one ends of the n vertical charge transfer sections and extending along the horizontal direction, the horizontal charge transfer section receiving the vertical transferred charges from the n vertical charge transfer sections horizontal line by horizontal line as received charges to transfer the received charges along the horizontal direction as horizontal transferred charges; at least one power feeding wire which is disposed on and electrically connected to at least the third vertical charge transfer electrode adjacent to the horizontal charge transfer section, which supplies clock pulses to at least the third vertical charge transfer electrode, and which serves as a first shading film for shading the third vertical charge transfer electrode from the incident light; a second shading film which is not electrically connected to the one power feeding wire and which shades areas between the photoelectric converting sections adjacent in the vertical direction to each other; a third shading film which is not electrically connected to the one power feeding wire and which shades areas between the one power feeding wire and the second shading film, between the one power feeding wire and the horizontal charge transfer section, and over the horizontal charge transfer section; and first through fourth vertical bus lines, which are formed outside from the image pickup region, each of the first through fourth vertical bus lines being alternately connected to the first and the second vertical charge transfer electrode via first contact hole while being not connected to the third vertical charge transfer electrode, one of the first through the fourth vertical bus lines being connected to the at least one power feeding wire via second contact hole, the first through the fourth vertical bus lines being supplied with first through fourth clock pulse signals, respectively, which are different in phase from one another, the first through the fourth vertical bus lines supplying the vertical transferring clocks to the first, the second, and the third vertical charge transfer electrodes to make the n vertical charge transfer sections transfer the read charges along the vertical direction as the vertical transferred charges.

The one power feeding wire may be electrically connected to the third vertical charge transfer electrode via contact hole.

The one power feeding wire and the second shading film may be manufactured in the same manufacturing process as each others The first contact hole and the second contact hole may be manufactured in the same manufacturing process as each other.

BRIEF DESCRIPTION OF THE DRAWINGS

FIG. 1 is a schematic plan view of a general solid-state image pickup device;

FIG. 2 is a plan view of a structure around a connecting portion between the vertical CCD register and the horizontal CCD register in a first conventional solid-state image pickup device of an interline transfer type;

FIGS. 3A and 3B are cross-sectional views along line A–A' and line B–B' in FIG. 2, respectively;

FIG. 4 is a schematic plan view for explaining a method of supplying transfer pulses to the vertical transfer electrodes in the first conventional solid-state image pickup device illustrated in FIG. 2;

FIG. 5 is a plan view of a structure around a connecting portion between the vertical CCD register and the horizontal CCD register in a second conventional solid-state image pickup device of an interline transfer type;

FIGS. 6A and 6B are cross-sectional views along line A–A' and line B–B' in FIG. 5, respectively;

DESCRIPTION OF THE PREFERRED EMBODIMENTS

Figure 7A:
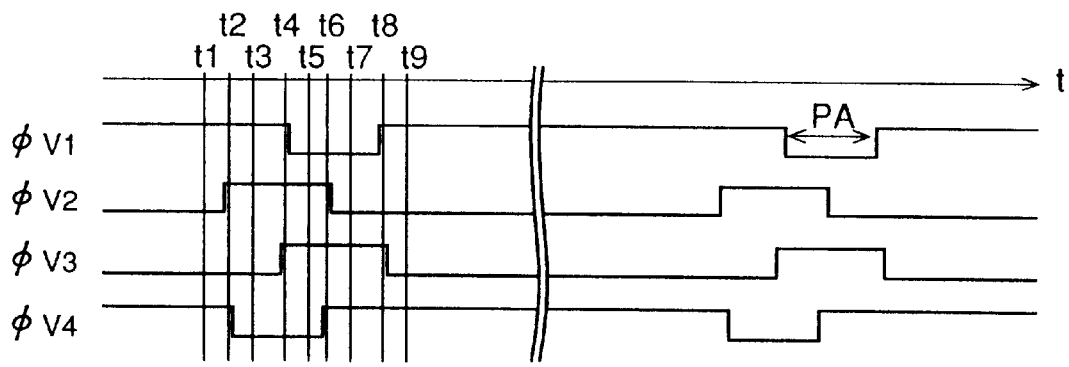
FIG. 7A is a timing chart of transfer pulses supplied to each vertical transfer electrode.

Referring to FIG. 1, a general solid-state image pickup device will be described at first in order to facilitate an understanding of the present invention. The device is called a CCD solid-state image pickup device of interline transfer (ILT) type.

In FIG. 1, the solid-state image pickup device comprises a plurality of photoelectric converting sections 101, such as photodiodes, arranged in the configuration of a matrix with m rows and n columns, where m and n represent first and second positive integers each of which is not less than two. For simplified description, it is assumed that the first positive integer m is an even number and the second positive integer n is a multiple of four. The m rows of the photoelectric converting sections 101 are disposed with a horizontal space left between the adjacent photoelectric converting sections 101 in a vertical direction Likewise, the n columns of the photoelectric converting sections 101 are disposed with a vertical space left between the adjacent photoelectric converting sections 101 in a horizontal direction The photoelectric converting sections 101 accumulate, in response to incident light, electric charges as signal charges The photoelectric converting sections 101 correspond to picture elements or pixels 106, respectively The device further comprises n vertical charge transfer sections 102, such as vertical CCD registers, adjacent to the n columns of the photoelectric converting sections 101 at one sides thereof. Each of the n vertical charge transfer sections 102 extends along the vertical direction and is arranged in the vertical space between the photoelectric converting sections 101. In the manner which will later become clear, each of the n vertical charge transfer sections 102 comprises a vertical charge transfer region and a plurality of vertical charge transfer electrodes The n vertical charge transfer sections 102 read the signal charges out of the photoelectric converting sections 101 in the respective n columns as read charges to transfer the read charges along the vertical direction as vertical transferred charges. A horizontal charge transfer section 103, such as horizontal CCD register, is connected to one ends of the n vertical charge transfer sections 102. The horizontal charge transfer section 103 extends along the horizontal direction. The horizontal charge transfer section 103 receives the vertical transferred charges from the n vertical charge transfer sections 102 horizontal line by horizontal line as received charges to transfer the received charges along the horizontal direction as horizontal transferred charges. An output circuit section 104 is connected to an end of the horizontal charge transfer section 103. The output circuit section 104 receives the horizontal transferred charges to convert the horizontal transferred charges into a voltage signal. The output circuit section 104 includes a charge detector 104a and an output amplifier 104b. The charge detector 104a detects the horizontal transferred charges transferred from the horizontal charge transfer section 103 to produce charge detected signals. The output amplifier 104b amplifies the charge detected signals to be supplied to an output terminal 108. Those components are isolated from one another by a plurality of element isolation sections 116.

Referring now to FIG. 2 and FIGS. 3A and 3B, the description will proceed to a first conventional solid-state image pickup device.

FIG. 2 is a view for explaining a structure around a connecting portion between the n vertical charge transfer sections 102 and the horizontal charge transfer section 103. In the example being illustrated, the n vertical charge transfer sections 102 is driven by applying vertical transfer pulses of first through fourth clock pulse signals $\phi 1$, $\phi 2$, $\phi 3$, and $\phi 4$ while the horizontal charge transfer section 103 is driven by applying horizontal transfer pulses of primary and secondary clock pulse signals $\phi H1$ and $\phi H2$.

As illustrated in FIG. 2, the n vertical charge transfer sections 102 have a plurality of first and second vertical charge transfer electrodes 112, 113, a third vertical charge transfer electrode 114, and charge transfer channels 111. Above the channels 111 of the n vertical charge transfer sections 102, a plurality of the first and the second vertical charge transfer electrodes 112 and 113 are formed to extend in the horizontal direction of the image pickup region 107 (shown in FIG. 1). The third vertical charge transfer electrode 114 is also formed to extend in the horizontal direction of the image pickup region 107, adjacent to the horizontal charge transfer section 103. Accordingly, the third vertical charge transfer electrode 114 can also be called, "the final vertical charge transfer electrode".

Except for each opened area above each of the photoelectric converting sections 101, a shading film 115 made of tungsten, aluminum, or the like, is formed on the image pickup region 107 and the horizontal charge transfer section 103. On the other hand, the shading film 115 is also formed above the photoelectric converting sections 101 located within an optical black area (In FIG. 2, only one picture element is shown in a vertical direction for brevity of explanation)

Element isolation sections 116, such as element isolation layers, are formed between the channels 111 of the n vertical charge transfer sections 102 within areas where no photoelectric converting section 101 is formed therein (In FIG. 2, five vertical transfer electrodes are formed in the areas).

An end of a channel 111 of each of the n vertical charge transfer sections 102 is connected to a channel 117 of the horizontal charge transfer section 103.

Above the channel 117 of the horizontal charge transfer section 103, a plurality of primary and secondary horizontal charge transfer electrodes 118 and 119 are formed. Each of the primary and the secondary horizontal charge transfer electrodes 118 and 119 extends over an area where a thick $SiO_2$ film is formed (Hereinunder, called a field area) to be connected to a horizontal bus line 121 through a contact 120.

Referring now to FIGS. 3A and 3B with reference to FIGS. 1 and 2 continued, description is made as regards a structure of the picture element 106 illustrated in FIG. 1.

FIGS. 3A and 3B are cross sectional views along the lines A–A' and B–B' in FIG. 2, respectively.

As shown in FIGS. 3A and 3B, the first conventional solid-state image pickup device comprises an N-type semiconductor substrate 131. The N-type semiconductor substrate 131 is prepared in a known manner and has a principal surface which is directed upwards of FIGS. 3A and 3B. On the principal surface of the N-type semiconductor substrate 131, a P-type well layer 132 having a surface area is formed. In the surface area of the P-type well layer 132, m by n N-type semiconductor regions 133, m by n $P^+$-type semiconductor regions 134, n N-type semiconductor regions 135, n P-type semiconductor regions 136, and a plurality of element isolation regions 138 are formed. The m by n N-type semiconductor regions 133 and the m by n $P^+$-type semiconductor regions 134 collectively act as the m by n photoelectric converting sections 101 (shown in FIG. 1). In addition, the m by n $P^+$-type semiconductor regions 134 prevent dark current from being produced. The n N-type semiconductor regions 135 serve as the n vertical charge transfer regions of the n vertical charge transfer sections 102 (shown in FIG. 1). The n P-type semiconductor regions 136 are formed under the n N-type semiconductor regions 135. The element isolation regions 138 are composed of the element isolation sections 116. The element isolation regions 138 are formed between the m by n N-type semiconductor regions 133 and the n N-type semiconductor regions 135 except for m by n reading-gate regions 137. A first insulation film 139 made of $SiO_2$, $Si_3N_4$, and the like, is formed over the P-type well layer 132, over the m by n $P^+$-type semiconductor regions 134, over the n N-type semiconductor regions 135, and over the element isolation regions 138. In addition, as illustrated in FIGS. 3A and 3B, second insulation film 140, third insulation film 141, and fourth insulation film 142 each of which is made of $SiO_2$, and the like, are formed thereover. Through the first, the second, the third, and the fourth insulation films 139, 140, 141, and 142, (m−1) sets of first and second vertical charge transfer electrodes 112 and 113 each of which is made of polycrystalline silicon are formed. The shading film 115 is also formed therethrough over the first and second vertical charge transfer electrodes 112 and 113.

FIG. 4 is a view for explaining a method of supplying charge transfer pulses to the m sets of first and second vertical charge transfer electrodes 112 and 113.

In FIG. 4, illustration is made only about a lefthand portion of the image pickup section 107 (shown in FIG. 1). A righthand portion of the image pickup section 107 has a structure similar to that of the lefthand portion.

Referring to FIG. 4, m sets of the first, the second, and the third (final) vertical charge transfer electrodes 112, 113, and 114 extend in a horizontal direction to be connected to vertical bus lines 151 through contacts 152 in the field area positioned outside of the image pickup section 107.

In the first conventional solid-state image pickup device mentioned above, the vertical charge transfer pulses are supplied from both ends of the image pickup section 107 to the first, the second, and the third (final) vertical charge transfer electrodes 112, 113, and 114. As a result, bluntness of waveform of the vertical charge transfer pulses is caused to occur in a central portion of the image pickup section 107 due to resistance and capacitance of the first, the second, and the third (final) vertical charge transfer electrodes 112, 113, and 114. This brings about deterioration of such a vertical charge transfer efficiency. The problem is serious when the solid-state image pickup device has a large effective picture elements area in size, for example, an optical size of one inch.

In order to overcome this problem, proposal has been made by Unexamined Japanese patent publication 216672/ 1992. In this paper, a method of preventing the aforesaid bluntness of waveform of the pulses is disclosed. In this method, charge transfer pulses are supplied to vertical charge transfer electrodes by metal wires along each vertical charge transfer section and thereabove.

Referring to FIGS. 5 and 6, description is made about a second conventional solid-state image pickup device.

FIG. 5 is a view for explaining a structure around a connecting portion between the n vertical charge transfer section and the horizontal charge transfer section in the second conventional solid-state image pickup device of an interline transfer type. The second conventional solid-state image pickup device has a structure similar to that of the above-mentioned first conventional solid-state image pickup device illustrated in FIG. 2 except for the following points. Similar portions have like reference numerals.

In the second conventional solid-state image pickup device, as illustrated in FIG. 5, the first, the second, and the third (final) vertical charge transfer electrodes 112, 113, and 114 are connected, through lining contacts 162, respectively, to shunt wires 161 each of which extends in a vertical direction along each vertical charge transfer section 102. The shunt wires 161 are made of tungsten, aluminum, or the like, and serve as first shading films for the n vertical charge transfer sections 102.

The shunt wires 161 are isolated from each other between picture elements adjacent in a horizontal direction As a result, the shunt wires 161 are not capable of shading areas (Hereinunder, called ferry portions) between the photoelectric converting sections 101 adjacent in a vertical direction to each other. Accordingly, it is inevitably caused to occur that smear is increased. In order to shade the ferry portions, second shading films 163 are formed in a horizontal direction in addition to the shunt wires 161 serving as the aforesaid first shading films. Furthermore, a third shading film 164 made of aluminum, and the like, is formed over the areas from the horizontal charge transfer section 103 to the photoelectric converting sections 101 within the optical black area (In FIG. 5, only one picture element is shown in a vertical direction for brevity of explanation).

Referring now to FIGS. 6A and 6B with reference to FIG. 5 continued, description is made as regards a structure of the picture element of the second conventional solid-state image pickup device illustrated in FIG. 5.

FIGS. 6A and 6B are cross sectional views along the lines A–A' and B–B' in FIG. 5, respectively.

As illustrated in FIG. 6A, the shunt wires 161 made of tungsten, aluminum, or the like, are formed over the second vertical charge transfer electrodes 113 with the insulation film 141 made of $SiO_2$, and the like, interposed therebetween. The second vertical charge transfer electrodes 113 are connected to the shunt wires 161 through lining contacts.

As illustrated in FIG. 6B, the first and the second vertical charge transfer electrodes 112 and 113 are formed in the aforesaid ferry portions. The second shading films 163 are formed further over the first and the second vertical charge transfer electrodes 112 and 113 with the insulation film 171 made of $SiO_2$, and the like, interposed therebetween.

Figure 7B:
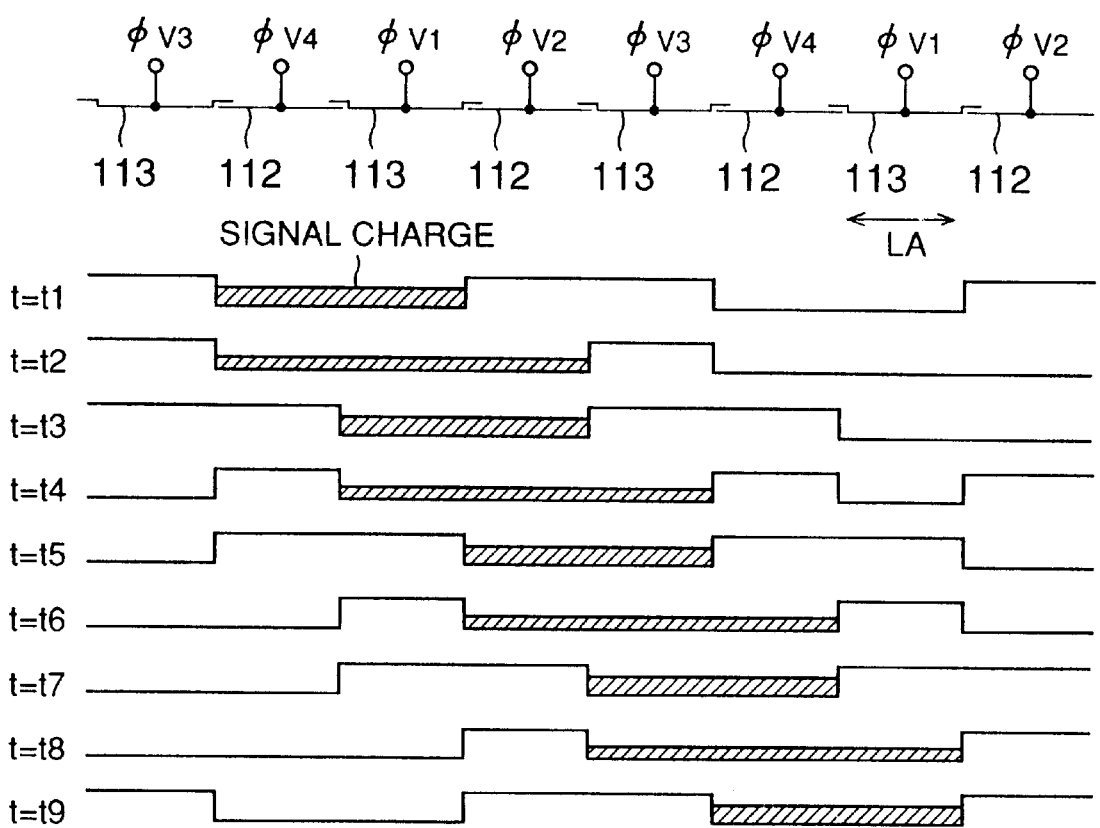
FIG. 7B is a view for showing channel voltage potential of a lower portion of each vertical transfer electrode, corresponding to each time t1 through t9 in FIG. 7A.

Referring in turn to FIGS. 7A and 7B, description proceeds to charge transfer operation in the n vertical charge transfer section 102.

FIGS. 7A and 7B are views for explaining the charge transfer operation in the n vertical charge transfer section 102. FIG. 7A is a timing chart of charge transfer pulses supplied to each vertical charge transfer electrode FIG. 7B is a view for showing channel voltage potential of a lower portion of each of the first and the second vertical charge transfer electrodes 112, 113, corresponding to each time t1 through t9 in FIG. 7A, where the channel voltage is positive in lower side of the drawing. Besides, description is made as regards only the charge transfer operation of signals of one packet for brevity of explanation.

In a time t1, high level transfer pulses $\phi V4$ and $\phi V1$ have been supplied to the channels of lower portions of each of the first and the second vertical charge transfer electrodes 112, 113 to have signal charges stored therein.

In a time t2, a transfer pulse $\phi V2$ has also become high level to be supplied to the channels of lower portions of the first, the second, and the first (three) vertical charge stored therein.

In a time t3, a transfer pulse $\phi V4$ has become low level to be supplied to the channels of lower portions of the second and the first (two) vertical charge transfer electrodes 113, 112 to have signal charges stored therein.

Thus, the position of the stored signal charges moved a distance corresponding one vertical charge transfer electrode during change t1 through t3. Thereafter, similar charge transfer operations are carried out during t4 through t9. Consequently, the position of the stored signal charges totally moves a distance corresponding four vertical charge transfer electrodes during change t1 through t9. Such charge transfer operations are repeatedly carried out to make the signal charge be transferred in the vertical charge transfer sections 102.

Referring to FIG. 8, description is made about charge transfer operation from the vertical charge transfer sections 102 to the horizontal charge transfer section 103.

Figure 8A:
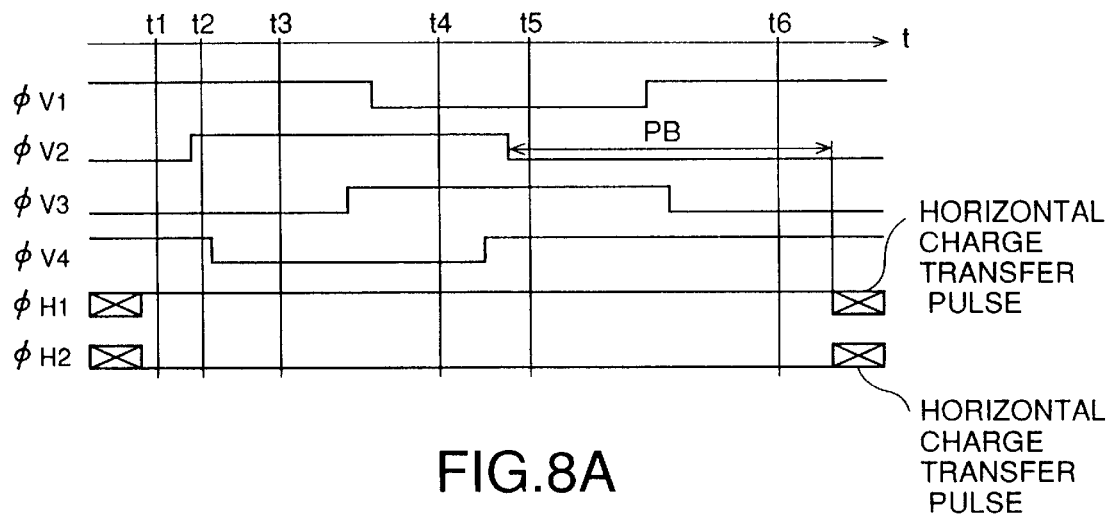
FIG. 8A is a timing chart of transfer pulses supplied to each vertical transfer electrode during horizontal blanking period.
Figure 8B:
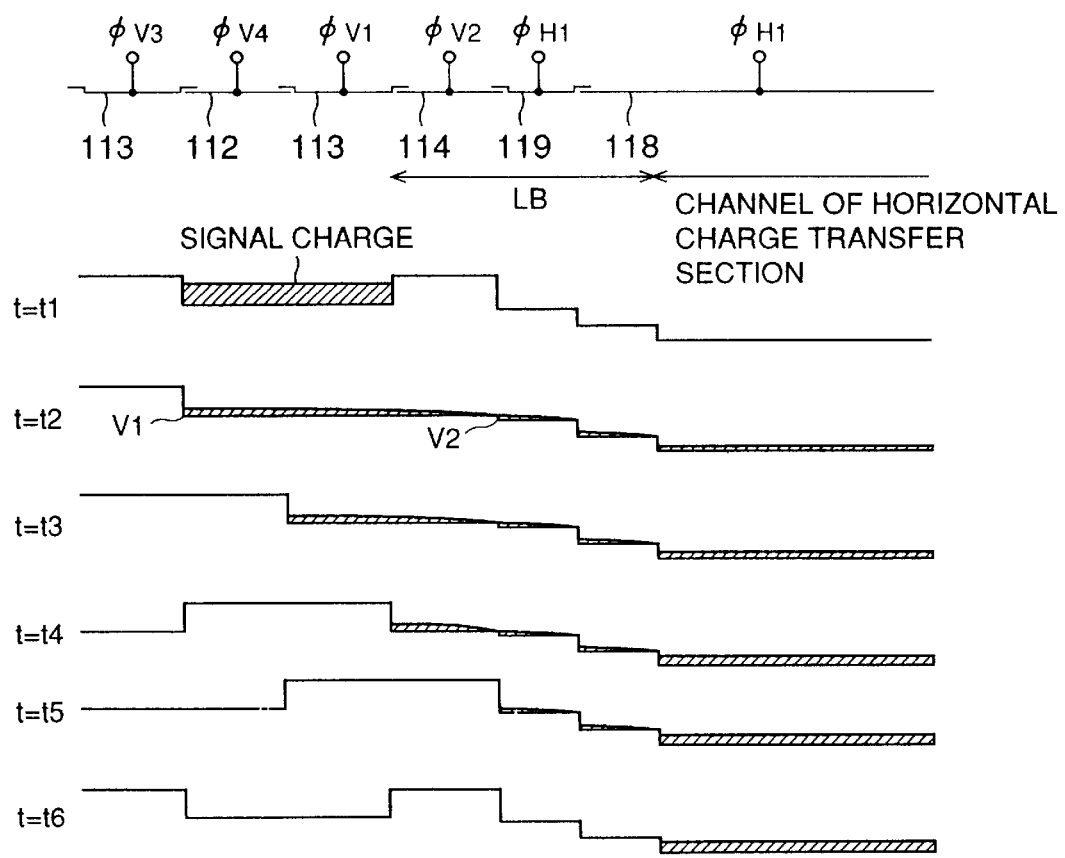
FIG. 8B is a view for showing channel voltage of a lower portion of each vertical transfer electrode, corresponding to each time t1 through t5 in FIG. 8A.

FIG. 8A is a timing chart of charge transfer pulses supplied to each of the first, the second, and the third (final) vertical charge transfer electrodes 112, 113, and 114 during horizontal blanking period. FIG. 8B is a view for showing channel voltage potential of a lower portion of each of the first, the second, and the third (final) vertical charge transfer electrodes 112, 113, and 114, corresponding to each time t1 through t5 in FIG. 8A, where the channel voltage is positive in lower side of the drawing. Further, as depicted in FIG. 8B, the first, the second, the third (final) vertical charge transfer electrodes 112, 113, 114, and the primary, the secondary horizontal charge transfer electrodes 118, 119 are arranged along C–C' line cross section illustrated in FIG. 2. Besides, description is made as regards only the charge transfer operation of signals of one packet for brevity of explanation.

In a time t1, high level charge transfer pulses φV4 and φV1 have been supplied to the channels of lower portions of each of the first and the second vertical charge transfer electrodes 112, 113 to have signal charge stored therein.

In a time t2, a charge transfer pulse φV2 has also become high level. The signal charge is transferred, through the secondary horizontal charge transfer electrode 119 to which φH1 is supplied, to the lower portions of the primary horizontal charge transfer electrode 118 to which φH1 is supplied. The channel voltage of the lower portion of the secondary horizontal charge transfer electrode 119 is made lower than that of the primary horizontal charge transfer electrode 118 by additional ion implantation. In the channel voltage of the lower portion of the primary horizontal charge transfer electrode 118, a channel voltage of a portion connected to the channel of the vertical charge transfer section is made lower than that connected to the channel 117 of the horizontal charge transfer section This is due to, what is called, narrow channel effect.

In a time t3, a charge transfer pulse φV4 has become low level. The signal charge remaining in the lower portions of vertical charge transfer electrodes (to which the charge transfer pulse φV4 was supplied) is transferred to the channel 117 of the horizontal charge transfer section.

In a time t4, a charge transfer pulse φV1 has become low level. The signal charge remaining in the lower portion of the second vertical charge transfer electrode 113 (to which the charge transfer pulse φV1 was supplied) is transferred to the channel 117 of the horizontal charge transfer section.

In a time t5, a charge transfer pulse φV2 has become low level. The signal charge remaining in the lower portion of the third (final) vertical charge transfer electrode 114 (to which the charge transfer pulse φV2 was supplied) is transferred to the channel 117 of the horizontal charge transfer section.

Accordingly, in a time t6, that is, immediately before the time when a horizontal charge transfer starts, all signal charges have been transferred to the channel 117 of the horizontal charge transfer section. In addition, the signal charges are transferred to the horizontal charge transfer section 103 by a horizontal charge transfer pulse during next horizontal effective period. Thereafter, the signal charges are detected by the charge detector 104*a* (shown in FIG. 1) to produce a charge detected signal. The charge detected signal is then amplified by the output amplifier 104*b* to produce an output signal.

When deterioration is caused to occur in charge transfer efficiency from the vertical charge transfer sections to the horizontal charge transfer section, a fixed pattern noise is generated in a regenerated image. The fixed pattern noise is observed as a fixed pattern like a black line extending in a vertical direction in the regenerated image, which makes quality of image be quite deteriorated.

In the second conventional solid-state image pickup device illustrated in FIG. 5, the third (final) vertical charge transfer electrode 114 is connected to the shunt wires 161 through the lining contacts 162. As a result, bluntness of waveform of the vertical charge transfer pulses is small in size, if caused to occur, in a central portion of the image pickup section 107. Accordingly, compared with the first conventional solid-state image pickup device illustrated in FIG. 2, vertical charge transfer efficiency is improved to prevent the fixed pattern noise from being generated.

It is a recent trend that solid-state image pickup devices have relatively small optical size of, for example, one-third inch or one-fourth inch. In case that such a solid-state image pickup device is designed to have, for example, four hundreds thousands effective picture elements, the picture element 106 is forced to have 5×5 through 8×8 micron meters in size. When the picture element has such a small size, smear characteristic becomes serious as one of main characteristics of a solid-state image pickup device. The smear characteristic degrades because spurious signal charges flowing the vertical charge transfer sections 102 increase. The smear is observed as a noise like a white line in a regenerated image.

One of the reasons of the smear is that incident light enters through chink between a shading film and a surface of a substrate Namely, the incident light reaches the channels of the vertical charge transfer sections and be subjected to photoelectric conversion therein. The photoelectric conversion is caused to occur due to multi-reflection between the surface of the substrate and the shading film or the vertical charge transfer electrode.

In the second conventional solid-state image pickup device illustrated in FIG. 5, the second shading films 163 are formed on the above-mentioned ferry portions to improve the smear characteristic. More incident light enters into the vertical charge transfer sections through the ferry portions in the second conventional solid-state image pickup device illustrated in FIG. 5 than in the first conventional solid-state image pickup device illustrated in FIG. 2. The reason is that a distance G2 illustrated in FIG. 6B between the second shading films 163 and the surface of the substrate is larger than another distance G1 illustrated in FIG. 3B between the shading film 115 and the surface of the substrate. This is further because the insulation film 171 exists, as depicted in FIG. 6B, between the shunt wires 161 and the second shading films 163.

Thus, the second conventional solid-state image pickup device illustrated in FIG. 5 has a problem that the smear characteristic is not sufficiently improved.

In order to improve the smear characteristic sufficiently, it can be considered that a distance between adjacent shunt wires 161 are designed to a narrow one, such as 0.1 through 0.2 micron meters only above the ferry portions. Patterning of such shunt wires 161 requires a high-technology, such as direct electron beam lithography of photo resist. Introduction of such a new process technique brings about some disadvantages, such as changes of manufacturing process, increase of manufacturing cost, and the like. Further, leavings of etching are easily produced in the ferry portions, because the ferry portions have large steps due to overlapping of the vertical charge transfer electrodes. It is therefore difficult that the adjacent shunt wires 161 are formed to have a narrow distance, such as 0.1 through 0.2 micron meters only over the ferry portions.

On the other hand, in the first conventional solid-state image pickup device illustrated in FIG. 2, it can be considered that the vertical charge transfer pulses are supplied through an independent terminal only to the third (final) vertical charge transfer electrode 140 Thereby, load against the vertical charge transfer pulses becomes small, bluntness of waveform thereof can be prevented. However, this causes another undesirable problem that one terminal is further required for the independent terminal.

Referring to FIGS. 9 to 13 with reference to FIG. 1 continued, description will proceed to a solid-state image pickup device according to a first embodiment of this invention. The device is called a CCD solid-state image pickup device of an interline transfer (ILT) type.

Figure 9:
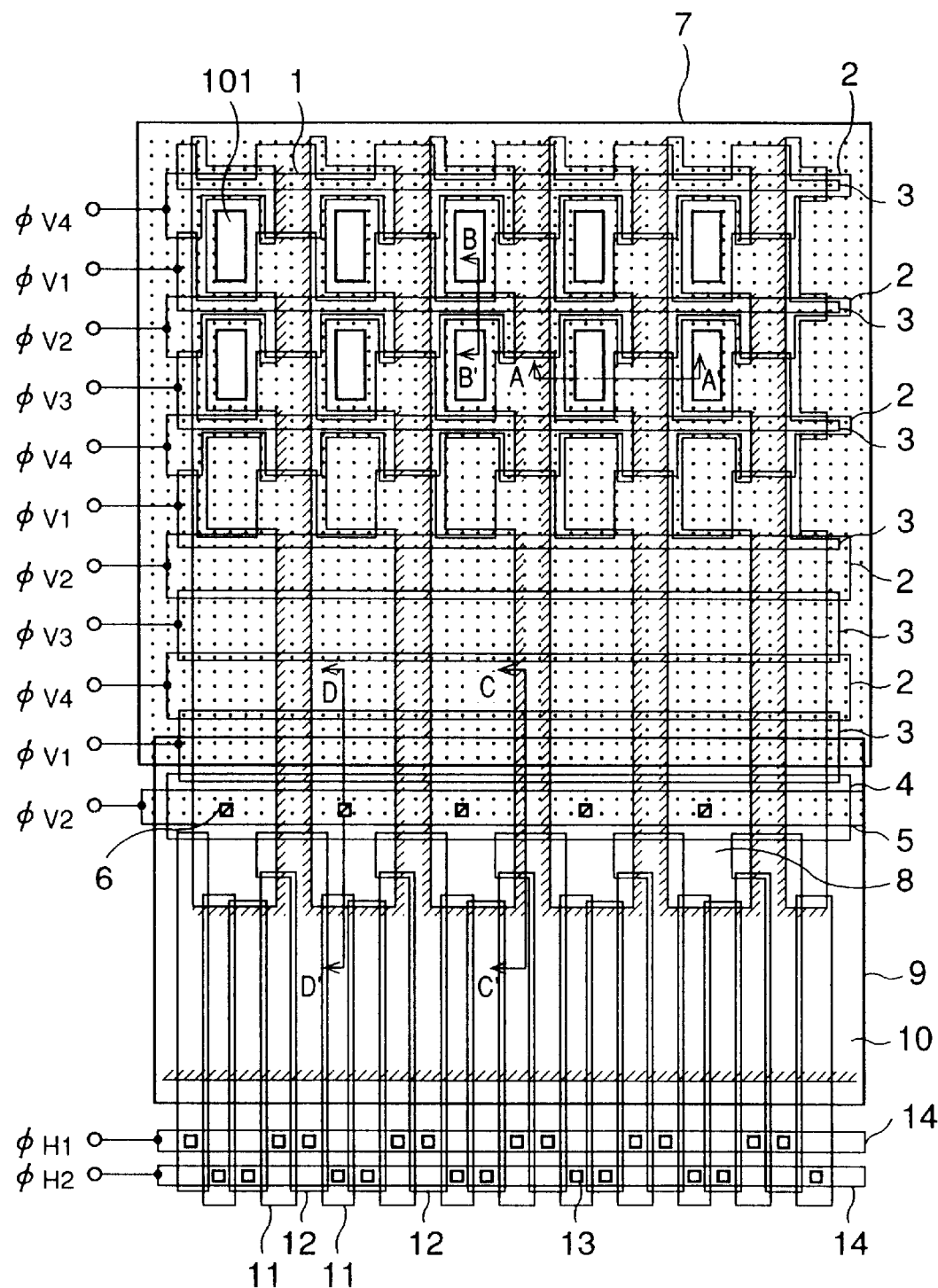
FIG. 9 is a plan view of a structure around a connecting portion between the vertical CCD register and the horizontal CCD register in a solid-state image pickup device of an interline transfer type according to a first embodiment of the present invention.

As illustrated in FIGS. 1 and 9, the solid-state image pickup device according to the first embodiment comprises a plurality of photoelectric converting sections 101, such as photodiodes, arranged in the configuration of a matrix with m rows and n columns where m and n represent first and second positive integers each of which is not less than two, n vertical charge transfer sections 102 adjacent to the n columns of the photoelectric converting sections 101 at one sides thereof, each of the n vertical charge transfer sections 102 extending along a vertical direction, each of the n vertical charge transfer sections 102 including m−1 clusters of first and second vertical charge transfer electrodes 2 and 3 alternately arranged along the vertical direction, a third (final) vertical charge transfer electrode 4 finally positioned in a vertical charge transfer direction, and a vertical charge transfer region or channel 1 formed beneath the m−1 clusters of first and second vertical charge transfer electrodes 2 and 3 and the third vertical charge transfer electrode 4, a horizontal charge transfer section 103 connected to one ends of the n vertical charge transfer sections 102 and extending along the horizontal direction, the horizontal charge transfer section 103 including a plurality of primary and secondary horizontal charge transfer electrodes 11 and 12 alternately arranged along the horizontal direction, and a horizontal charge transfer region or channel 10 formed beneath the primary and secondary horizontal charge transfer electrodes 11 and 12, one power feeding wire 5, such as shunt wire, which is disposed on the third vertical charge transfer electrode 4 adjacent to the horizontal charge transfer section 103, which is electrically connected to the third vertical charge transfer electrode 4 via first contact hole 6, which supplies clock pulses to the third vertical charge transfer electrode 4, and which serves as a first shading film for shading the third vertical charge transfer electrode 4 from the incident light, a second shading film 7 which is not electrically connected to the one power feeding wire 5 and which shades areas between the photoelectric converting sections 101 adjacent in the vertical direction to each other, and a third shading film 9 which is not electrically connected to the one power feeding wire 5 and which shades areas between the one power feeding wire 5 and the second shading film 7, between the one power feeding wire 5 and the horizontal charge transfer section 103, and over the horizontal charge transfer section 103, an output circuit section 104 connected to an end of the horizontal charge transfer section 103, and including a charge detector 104a and an output amplifier 104b. Those components are isolated from one another by a plurality of element isolation section 8 (in FIG. 9. In FIG. 1, reference numeral of the element isolation sections is 116).

The photoelectric converting sections 101 accumulate in response to incident light, electric charges as signal charges. The n vertical charge transfer sections 102 are for reading the signal charges out of the photoelectric converting sections 101 as read charges to transfer the read charges along the vertical direction as vertical transferred charges. The horizontal charge transfer section 103 receives the vertical transferred charges from the n vertical charge transfer sections 102 horizontal line by horizontal line as received charges to transfer the received charges along the horizontal direction as horizontal transferred charges. The output circuit section 104 receives the horizontal transferred charges to convert the horizontal transferred charges into a voltage signal. Namely, the charge detector 104a detects the horizontal transferred charges transferred from the horizontal charge transfer section 103 to produce charge detected signals. The output amplifier 104b then amplifies the charge detected signals to be supplied to an output terminal 108. Besides, the one power feeding wire 5 and the second shading film 7 are manufactured in the same manufacturing process as each other. In addition, the second shading film 7 is kept, for example, at ground potential In FIG. 9, the n vertical charge transfer sections 102 is driven by applying vertical transfer pulses of first through fourth clock pulse signals $\phi 1$, $\phi 2$, $\phi 3$, and $\phi 4$ while the horizontal charge transfer section 103 is driven by applying horizontal transfer pulses of primary and secondary clock pulse signals $\phi H1$ and $\phi H2$.

An end of a charge transfer channel 1 of each of the n vertical charge transfer sections 102 is connected to a charge transfer channel 10 of the horizontal charge transfer section 103. Above the charge transfer channel 10 of the horizontal charge transfer section 103, the primary and the secondary horizontal charge transfer electrodes 11 and 12 are formed. Each of the primary and the secondary horizontal charge transfer electrodes 11 and 12 extends over an area where a thick $SiO_2$ film is formed (Hereinunder, called a field area) to be connected to a horizontal bus line 14 through primary and secondary contact holes 13a and 13b.

Figure 10A:
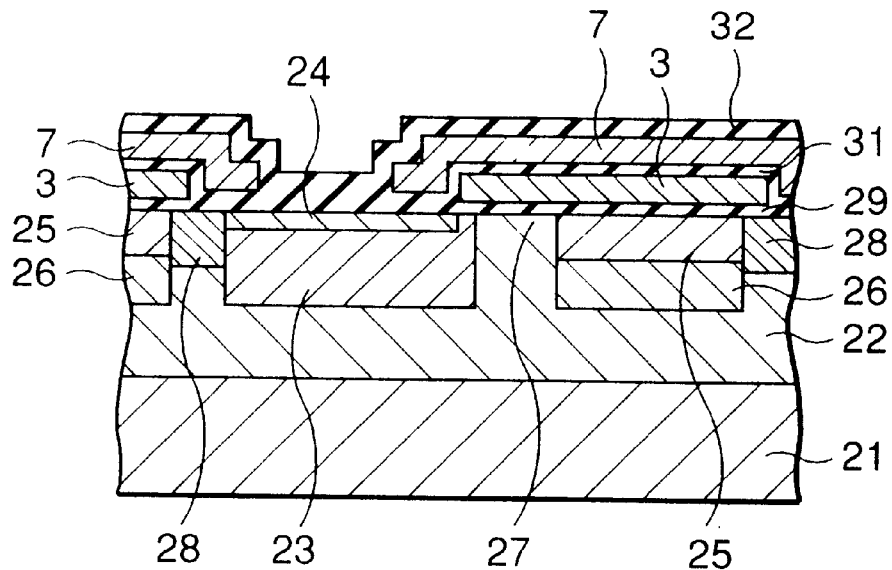
FIGS. 10A and 10B are cross-sectional views along line A–A' and line B–B' in FIG. 9, respectively.
Figure 10B:
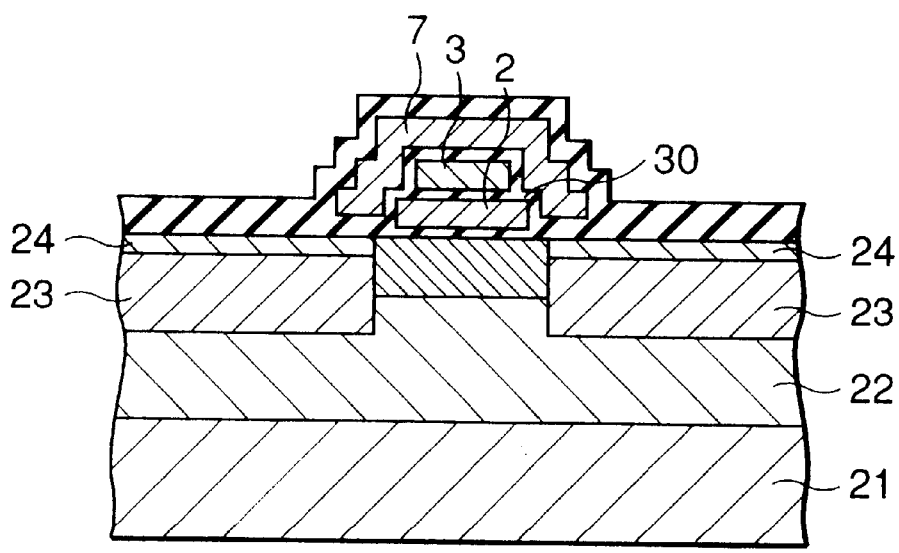

Referring now to FIGS. 10A and 10B with reference to FIGS. 1 and 9 continued, description is made as regards a structure of the picture element 106 illustrated in FIG. 9.

FIGS. 10A and 10B are cross sectional views along the lines A–A' and B–B' in FIG. 9, respectively As shown in FIGS. 10A and 10B, the solid-state image pickup device according to the first embodiment comprises an N-type semiconductor substrate 21. The N-type semiconductor substrate 21 is prepared in a known manner and has a principal surface which is directed upwards of FIGS. 10A and 10B. On the principal surface of the N-type semiconductor substrate 21, a P-type well layer 22 having a surface area is formed. In the surface area of the P-type well layer 22, m by n N-type semiconductor regions 23, m by n $P^+$-type semiconductor regions 24, n N-type semiconductor regions 25, n P-type semiconductor regions 26, and a plurality of element isolation regions 8 are formed. The m by n N-type semiconductor regions 23 and the m by n $P^+$-type semiconductor regions 24 collectively act as the m by n photoelectric converting sections 101 (shown in FIG. 1). In addition, the m by n $P^+$-type semiconductor regions 24 prevent dark current from being produced. The n N-type semiconductor regions 25 serve as the n vertical charge transfer regions of the n vertical charge transfer sections 102 (shown in FIG. 1). The n P-type semiconductor regions 26 are formed under the n N-type semiconductor regions 25. The element isolation regions 8 are formed between the m by n N-type semiconductor regions 23 and the n N-type semiconductor regions 25 except for m by n reading-gate regions 27. A first insulation film 29 made of $SiO_2$, $Si_3N_4$, and the like, is formed over the P-type well layer 22, over the m by n P+-type semiconductor regions 24, over the n N-type semiconductor regions 25, and over the element isolation regions 8. In addition, as illustrated in FIGS. 10A and 10B, second insulation film 30, third insulation film 31, and fourth insulation film 32 each of which is made of $SiO_2$, and the like, are formed thereover. Through the first, the second, the third, and the fourth insulation films 29, 30, 31, and 32, (m−1) sets of first and second vertical charge transfer electrodes 2 and 3 each of which is made of polycrystalline silicon are formed. The second shading film 7 is also formed therethrough over the first and second vertical charge transfer electrodes 2 and 3.

Figure 11A:
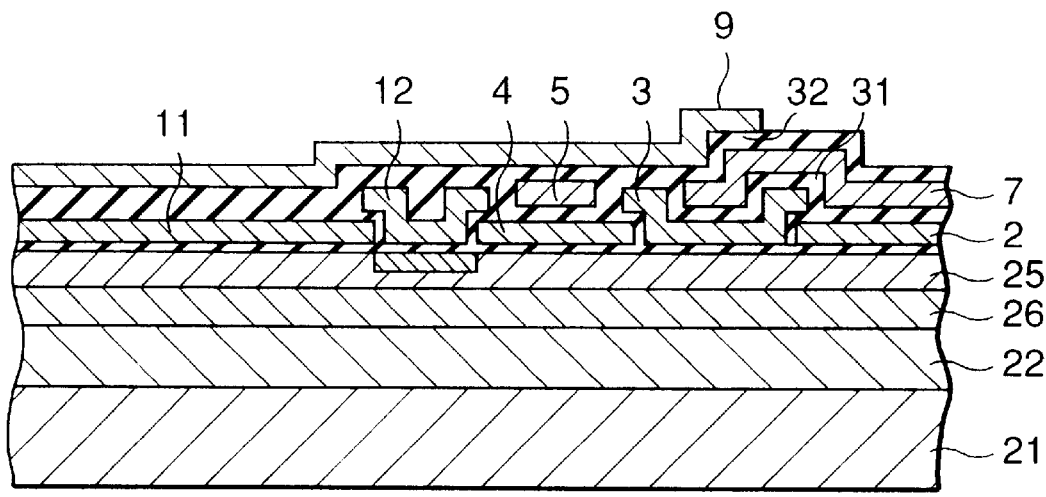
FIGS. 11A and 11B are cross-sectional views along line C–C' and line D–D' in FIG. 9, respectively.
Figure 11B:
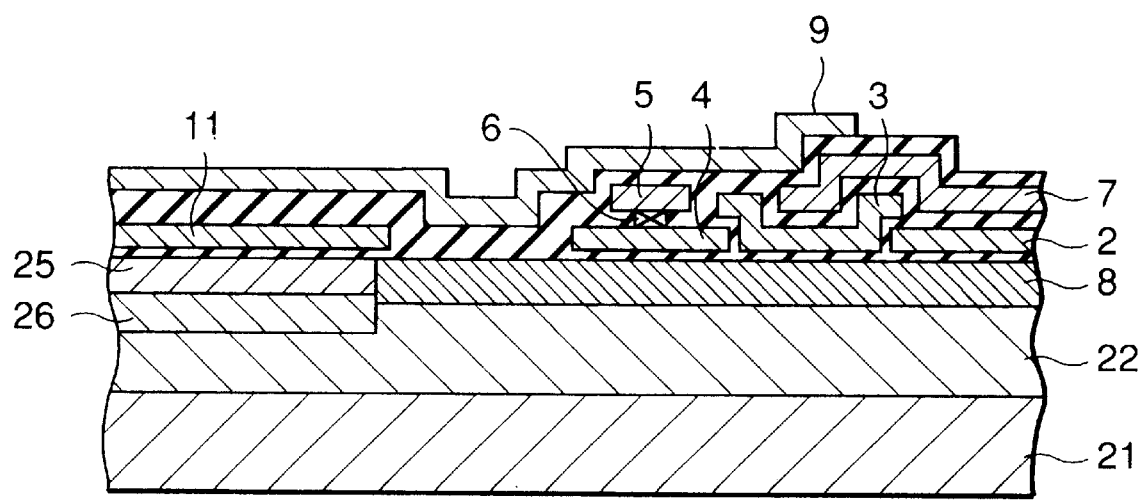

Referring next to FIGS. 11A and 11B, description is made about a connecting structure between the third (final) vertical charge transfer electrode 4 and the one power feeding wire 5 as well as respective position of the one power feeding wire 5 and the second shading film 7. FIGS. 11A and 11B are cross sectional views along C–C' and D–D' lines in FIG. 9, respectively Similar portions to FIGS. 10A and 10B have like reference numerals. In FIG. 11A, in the surface area of the P-type well layer 22, n N-type semiconductor regions 25 and n P-type semiconductor regions 26 are formed. Besides, under the secondary horizontal charge transfer electrode 12, an N−-type semiconductor region is formed by an additional ion implantation. Over the third (final) vertical charge transfer electrode 4, the one power feeding wire 5 is formed with the third insulation films 31 interposed therebetween. Over the first and second vertical charge transfer electrodes 2 and 3 other than the third (final) vertical charge transfer electrode 4, the second shading film 7 is formed with the third insulation films 31 interposed therebetween. On the primary and the secondary horizontal charge transfer electrodes 11, 12, on the one power feeding wire 5, on the second shading film 7, on and the like, the fourth insulation film 32 is formed. Further, on the fourth insulation film 32, the third shading film 9 is widely formed to cover a gap between the one power feeding wire 5 and the second shading film 7 and extend all over the horizontal charge transfer section 103 (FIG. 1).

In FIG. 11B, in the surface area of the P-type well layer 22, the element isolation regions 8 are formed except for the charge transfer channel region 10 of the horizontal charge transfer section 103 which is composed of the n N-type semiconductor regions 25 and n P-type semiconductor regions 26. The one power feeding wire 5, the second shading film 7, and the third shading film 9 are located similarly to those of FIG. 11A. It is particularly to be noted that the one power feeding wire 5 is connected to the third (final) vertical charge transfer electrode 4 through a lining contacts 6. Alternatively, the lining contacts 6 can be provided on the charge transfer channel 1 of the vertical charge transfer section 102.

Figure 12:
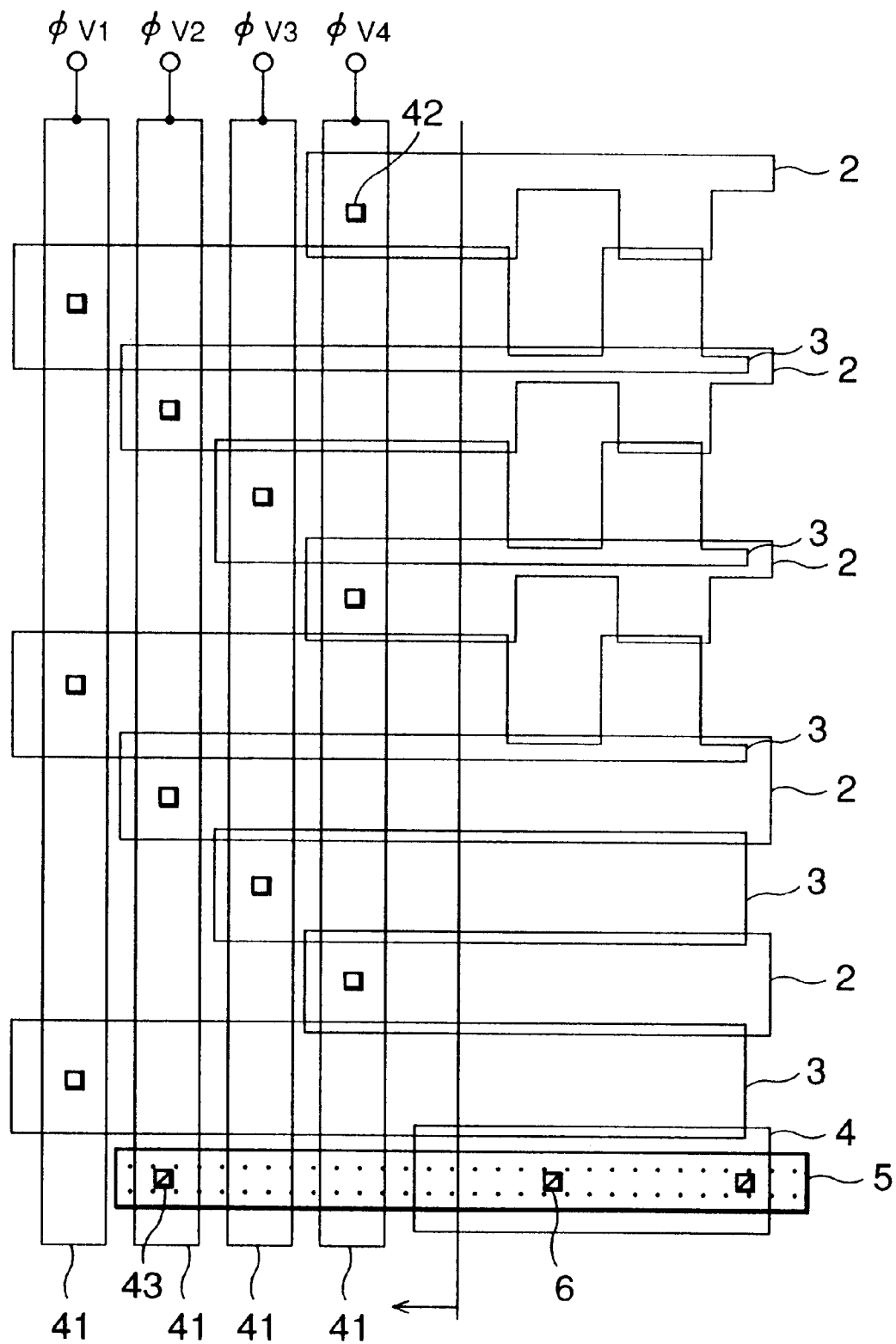
FIG. 12 is a schematic plan view for explaining a method of supplying transfer pulses to the vertical transfer electrodes in the solid-state image pickup device illustrated in FIG. 9.

FIG. 12 is a view for explaining a method of supplying charge transfer pulses to the m sets of first and second vertical charge transfer electrodes 2 and 3.

In FIG. 12, illustration is made only about a lefthand portion of the image pickup region 107 (shown in FIG. 1). A righthand portion of the image pickup region 107 has a structure similar to that of the lefthand portion.

Referring to FIG. 12, m sets of the first, the second, and the third (final) vertical charge transfer electrodes 2, 3, and 4 extend in a horizontal direction to be connected to first through fourth vertical bus lines 41. The first through the fourth vertical bus lines 41 are formed outside from the image pickup region 107. Each of the first through the fourth vertical bus lines 41 is alternately connected to the first and the second vertical charge transfer electrode 2 and 3 via first contact hole 42 while the first through the fourth vertical bus lines 41 are not connected to the third (final) vertical charge transfer electrode 4. One of the first through the fourth vertical bus lines 41 is connected to the one power feeding wire 5 via second contact hole 43. As mentioned above, the third (final) vertical charge transfer electrode 4 is electrically connected to the one power feeding wire 5 via third contact hole 6. Accordingly, the third (final) vertical charge transfer electrode 4 is electrically connected also to the one of the first through the fourth vertical bus lines 41. The first through the fourth vertical bus lines 41 are supplied with first through fourth clock pulse signals $\phi V1$ through $\phi V4$, respectively, which are different in phase from one another. The first through the fourth vertical bus lines 41 supply the vertical transferring clocks to the first, the second, and the third vertical charge transfer electrodes 2, 3, and 4 to make the n vertical charge transfer sections 102 transfer the read charges along the vertical direction as the vertical transferred charges. Besides, the first contact hole 42 and the second contact hole 43 are manufactured in the same manufacturing process as each other.

Herein, description is made as regards the reason why bluntness of waveform of the vertical transfer pulses is quite improved in the solid-state image pickup device illustrated in FIGS. 9 to 12.

For example, let the third (final) vertical charge transfer electrode 4 be made of polycrystalline silicon film having a thickness and the one power feeding wire 5 be made of tungsten film having the same thickness as that of the polycrystalline silicon film. Sheet resistance of the tungsten film becomes such a small value as about one over fifty through one over one hundred. By employing the one power feeding wire 5 electrically connected to the third (final) vertical charge transfer electrode 4, total wiring resistance becomes small enough to drastically improve the bluntness of waveform of the vertical transfer pulses.

In the interim, charge transfer operation in the n vertical charge transfer section 102 and charge transfer operation from the vertical charge transfer sections 102 to the horizontal charge transfer section 103 are similar to those of the first and the second prior art illustrated in FIGS. 7A, 7B and 8A, 8B.

Figure 13A:
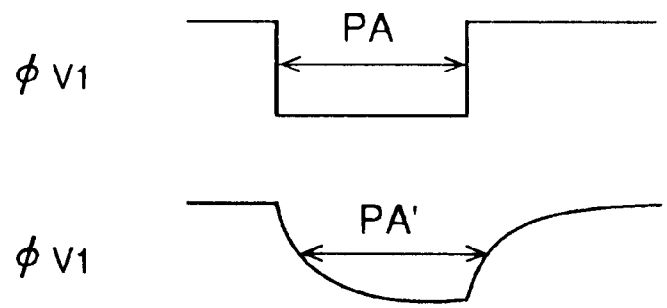
FIG. 13A is a view for explaining a change of transferring period PA illustrated in FIG. 7A, when bluntness of waveform of the vertical transfer pulses occurs.
Figure 13B:
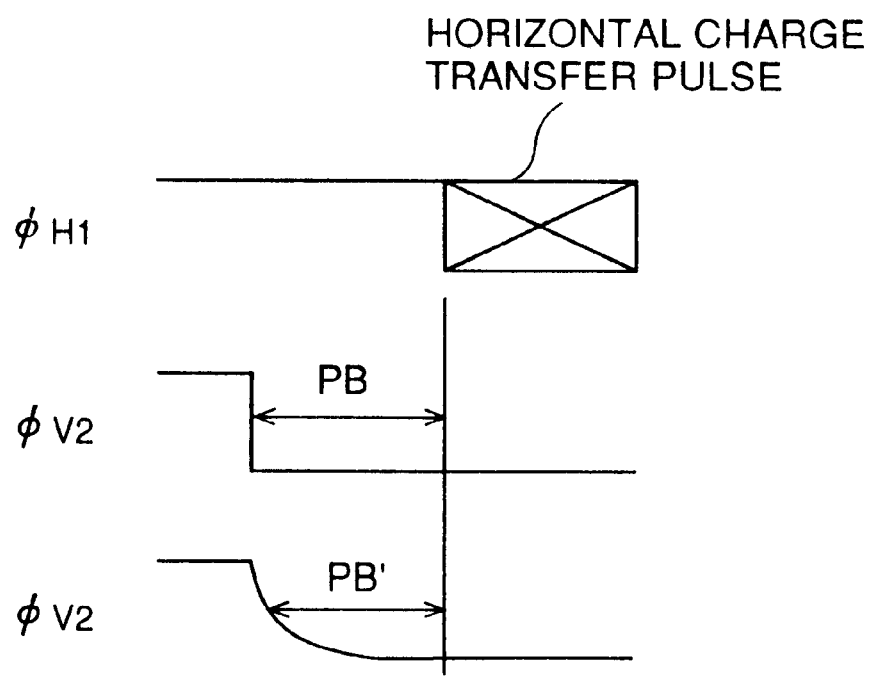
FIG. 13B is a view for explaining a change of transferring period PB illustrated in FIG. 8A, when bluntness of waveform of the vertical transfer pulses occurs.

Referring to FIGS. 13A and 13B with reference to FIGS. 7A, 7B and 8A, 8B, description proceeds to the reason why the one power feeding wire 5 is employed to be connected only to the third (final) vertical charge transfer electrode 4 through the lining contacts 6.

First, let a transfer efficiency of the charge transfer operation in the n vertical charge transfer section 102 (FIGS. 7A, 7B) be qualitatively compared with that of the charge transfer operation from the vertical charge transfer sections 102 to the horizontal charge transfer section 103 (FIGS. 8A, 8B). Hereinunder, in the charge transfer channels 111 (1) under the second and the third charge transfer electrodes 113 (3) and 114 (4), consideration is made as regards a signal charge existing in the most remote position from the transfer destination.

In the general charge transfer operation within the n vertical charge transfer section 102, the signal charge needs to be transferred by a distance LA (FIG. 7B) during a period PA (FIG. 7A) when the vertical transfer pulse $\phi V1$ becomes low level.

On the other hand, in the charge transfer operation from the vertical charge transfer sections 102 to the horizontal charge transfer section 103, the signal charge needs to be transferred by a distance LB (FIG. 8B) during a period PB (FIG. 8A), that is, until a horizontal transfer operation starts after the vertical transfer pulse φV2 supplied to the third charge transfer electrodes 114 (4) becomes low level.

As illustrated in FIGS. 8A and 8B, provided that the channel voltage V1 when the vertical transfer pulse of high level supplied to the third charge transfer electrodes 114 (4) is lower than the channel voltage V2 when the horizontal transfer pulse of high level supplied to the secondary horizontal charge transfer electrodes 119 (12), a signal charge transfer under the third charge transfer electrodes 114 (4) does not start until the vertical transfer pulse φV2 becomes high level. However, some signal charges are not transferred while the vertical transfer pulse φV2 is kept at high level but still remain under the third charge transfer electrodes 114 (4). Such residual electric charges are generated when voltage difference between V1 and V2 is such a small value as about 0 V through 1 V. These residual electric charges are transferred towards the charge transfer channel 117 (10) after the vertical charge transfer pulse of low level supplied to the third charge transfer electrodes 114 (4), like the time t5 illustrated in FIGS. 8A and 8B.

FIGS. 13A and 13B are views for explaining changes of the transfer periods PA and PB illustrated in FIGS. 7A and 8A.

In FIGS. 7A and 8A, a transfer period is defined as the period PA or PB when the pulse is kept completely at low level, provided that vertical charge transfer pulses are rectangular ones. In FIGS. 13A and 13B, on the contrary, an effective transfer period is defined as a period when the pulse is kept at low level than half level of amplitude of the pulse in the above-mentioned transfer of the residual electric charges. In this case, as depicted in FIG. 13A, deterioration of transfer efficiency is not large in the general charge transfer operation within the n vertical charge transfer section 102, since a transfer period PA, is substantially as long as the transfer period PA. On the other hand, as depicted in FIG. 13B, deterioration of transfer efficiency is violent in the charge transfer operation from the vertical charge transfer sections 102 to the horizontal charge transfer section 103, since a transfer period PB' is shorter than the transfer period PB due to bluntness of the vertical charge transfer pulse. In other words, if bluntness of the vertical charge transfer pulse is caused to occur, the charge transfer operation from the vertical charge transfer sections 102 to the horizontal charge transfer section 103 is strongly influenced, compared with the general charge transfer operation within the n vertical charge transfer section 102.

In view of the above, a fixed pattern noise as well as deterioration of transfer efficiency within the vertical charge transfer sections 102 can be prevented by employing the one power feeding wire 5 connected only to the third (final) vertical charge transfer electrode 4 through the lining contacts 6, except that an extreme bluntness of the vertical charge transfer pulse is caused to happen. In this embodiment of the present invention, since the first and the second vertical charge transfer electrodes 2 and 3 are not covered by any power feeding wires, the aforesaid ferry portions can be covered by the second shading film 7 which is formed nearer to the surface of the substrate than any power feeding wires. With this structure, smear characteristic is so improved. Particularly, this structure brings very advantageous effect when applied to such a solid-state image pickup device having comparatively small optical size of, for example, one-third inch or one-fourth inch and picture element size of, for example, 5×5 through 8×8 micron meters.

Figure 14:
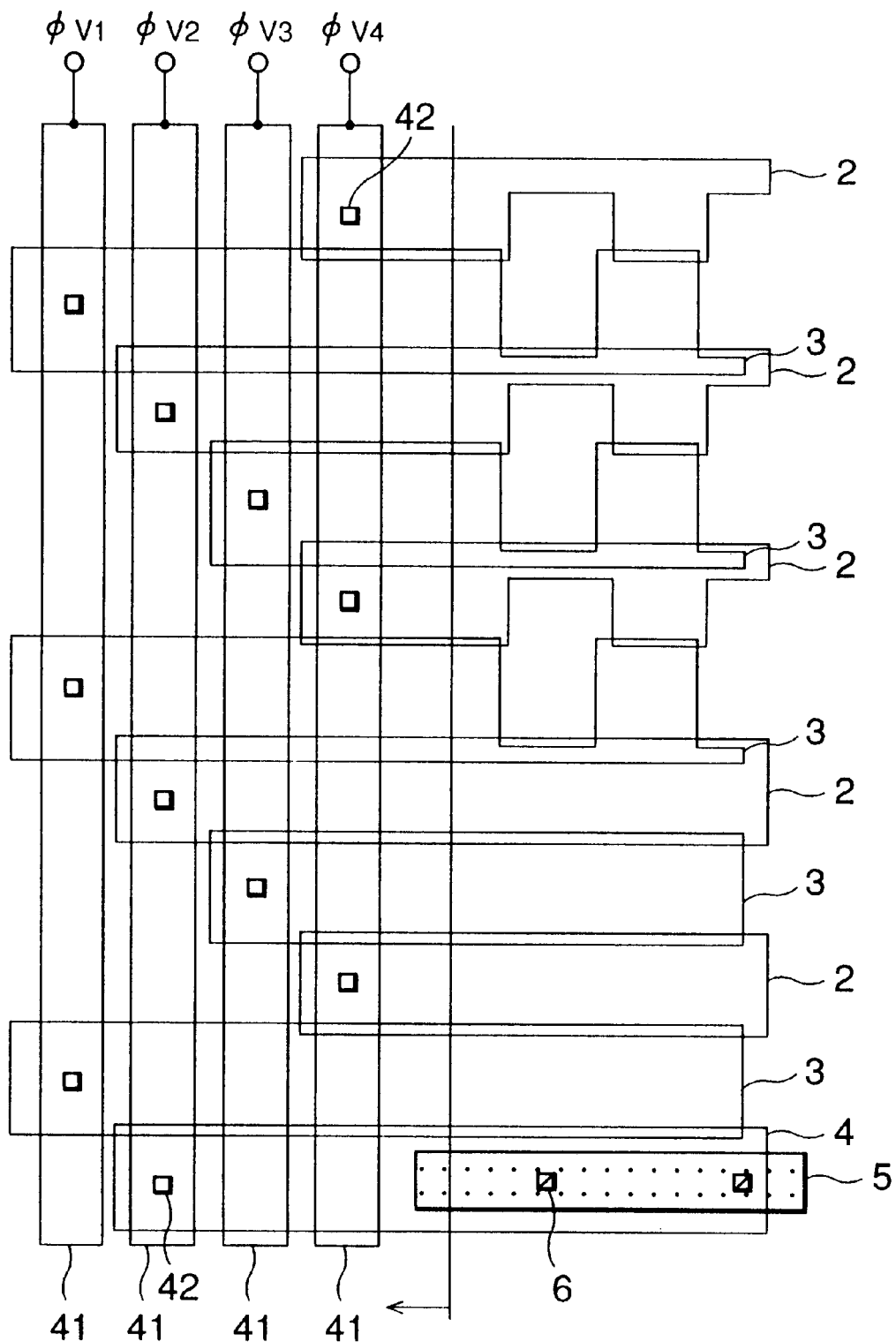
FIG. 14 is a schematic plan view for explaining another method of supplying transfer pulses to the vertical transfer electrodes in the solid-state image pickup device illustrated in FIG. 9.

FIG. 14 is a view for explaining another method of supplying charge transfer pulses to the sets of first, second, and third vertical charge transfer electrodes 2, 3, and 4 in a solid-state image pickup device according to a second embodiment of the present invention.

In FIG. 14, illustrated example has a structure similar to that of FIG. 12 except for the following points.

As illustrated in FIG. 14, the third (final) vertical charge transfer electrode 4 is connected to the vertical bus line 41 through the first contact 42. On the other hand, the shunt wire 5 is not directly connected to the vertical bus line 41.

Also in this embodiment, the third (final) vertical charge transfer electrode 4 is made of polycrystalline silicon film having a thickness and the shunt wire 5 is made of tungsten film having the same thickness as that of the polycrystalline silicon film Sheet resistance of the tungsten film becomes such a small value as about one over fifty through one over one hundred. By employing the shunt wire 5 electrically connected to the third (final) vertical charge transfer electrode 4, total wiring resistance becomes small enough to drastically improve the bluntness of waveform of the vertical transfer pulses, similarly to the first embodiment mentioned with respect to FIG. 12.

Figure 15:
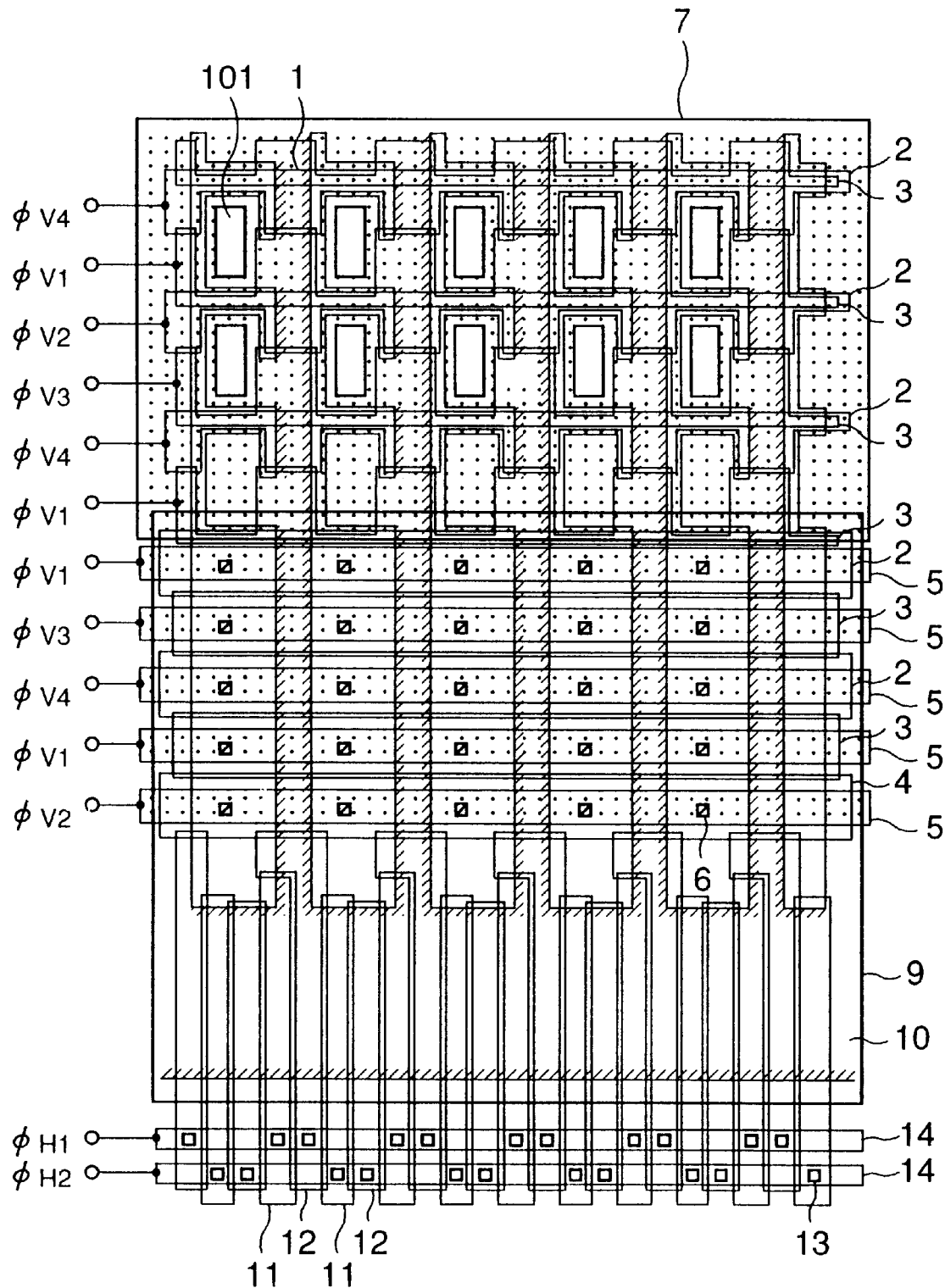
FIG. 15 is a plan view of a structure around a connecting portion between the vertical CCD register and the horizontal CCD register in a solid-state image pickup device of an interline transfer type according to a second embodiment of the present invention.

Referring to FIG. 15, description proceeds to a solid-state image pickup device according to a third embodiment of the present invention.

FIG. 15 is a view for explaining a structure around the connecting portion between the vertical charge transfer section 102 and the horizontal charge transfer section 103. The solid-state image pickup device according to this embodiment has a structure basically similar to that of the first embodiment except for the following points. Similar portions have like reference numerals.

As illustrated in FIG. 15, five shunt wires 5 are formed in a horizontal direction over a part of the first and the second vertical charge transfer electrodes 2 and 3 located in areas between the photoelectric converting sections 101 and the horizontal charge transfer section 103. The five shunt wires 5 are electrically connected not only to the third (final) vertical charge transfer electrode 4 but also a part of the first and the second vertical charge transfer electrodes 2 and 3 through lining contacts 6, respectively. Except for opened areas above the photoelectric converting sections 101, the second shading film 7, which is not electrically connected to the five shunt wires 5, is formed over the image pickup region 107. Further, the third shading film 9 made of aluminum, and the like, is formed to cover a gap between the shunt wires 5 and the second shading film 7, gaps between the five shunt wires 5 each other, and the horizontal charge transfer section 103 itself.

Also in this embodiment, one of the five shunt wires 5 is electrically connected to the third (final) vertical charge transfer electrode 4 through lining contacts 6. The second shading film 7 covers the above-mentioned ferry portions in the image pickup region 107. Accordingly, advantageous effects similar to those of the first embodiment can be obtained with the structure of the solid-state image pickup device according to the third embodiment of the present invention.

While this invention has thus far been described in conjunction with a few embodiments thereof, it will now be readily possible for those skilled in the art to put this invention into practice in various other manners. For example, this invention can be applied to solid-state image pickup devices of the other driving type except for those of surface channel type. Further, the charge transfer electrodes can be made of one layer of polysilicon or three or more layers of polysilicon.

What is claimed is:

1. A solid-state image pickup device comprising:
   a plurality of photoelectric converting sections, arranged in the configuration of a matrix with m rows and n columns, for accumulating, in response to incident light, electric charges as signal charges where m and n represent first and second positive integers each of which is not less than two;
   n vertical charge transfer sections adjacent to the n columns of said photoelectric converting sections at one side thereof, each of said n vertical charge transfer sections extending along a vertical direction, said n vertical charge transfer sections being for reading the signal charges out of said photoelectric converting sections as read charges to transfer the read charges along the vertical direction as vertical transferred charges, each of said n vertical charge transfer sections including m−1 clusters of first and second vertical charge transfer electrodes alternately arranged along the vertical direction, a third vertical charge transfer electrode finally positioned in a vertical charge transfer direction, and a vertical charge transfer region formed beneath the m−1 clusters of first and second vertical charge transfer electrodes and the third vertical charge transfer electrode;
   a horizontal charge transfer section connected to one ends of said n vertical charge transfer sections and extending along the horizontal direction, said horizontal charge transfer section receiving said vertical transferred charges from said n vertical charge transfer sections horizontal line by horizontal line as received charges to transfer the received charges along the horizontal direction as horizontal transferred charges;
   at least one power feeding wire which is disposed on and electrically connected to at least said third vertical charge transfer electrode adjacent to said horizontal charge transfer section, which supplies clock pulses to at least said third vertical charge transfer electrode, and which serves as a first shading film for shading said third vertical charge transfer electrode from the incident light;
   a second shading film which is not electrically connected to said one power feeding wire and which shades areas between said photoelectric converting sections adjacent in the vertical direction to each other; and
   a third shading film which is not electrically connected to said one power feeding wire and which shades areas between said one power feeding wire and said second shading film, between said one power feeding wire and said horizontal charge transfer section, and over said horizontal charge transfer section.

2. A solid-state image pickup device as claimed in claim 1, wherein said one power feeding wire is electrically connected to said third vertical charge transfer electrode via contact hole.

3. A solid-state image pickup device as claimed in claim 1, wherein said one power feeding wire is made of tungsten while said third vertical charge transfer electrode is made of polycrystalline silicon.

4. A solid-state image pickup device as claimed in claim 1, wherein said one power feeding wire and said second shading film are manufactured in the same manufacturing process as each other.

5. A solid-state image pickup device comprising:
   a plurality of photoelectric converting sections, arranged in the configuration of a matrix with m rows and n columns, for accumulating, in response to incident light, electric charges as signal charges where m and n represent first and second positive integers each of which is not less than two;
   n vertical charge transfer sections adjacent to the n columns of said photoelectric converting sections at one side thereof, each of said n vertical charge transfer sections extending along a vertical direction, said n vertical charge transfer sections being for reading the signal charges out of said photoelectric converting sections as read charges to transfer the read charges along the vertical direction as vertical transferred charges, each of said n vertical charge transfer sections including m−1 clusters of first and second vertical charge transfer electrodes alternately arranged along the vertical direction, a third vertical charge transfer electrode finally positioned in a vertical charge transfer direction, and a vertical charge transfer region formed beneath the m−1 clusters of first and second vertical charge transfer electrodes and the third vertical charge transfer electrode;
   a horizontal charge transfer section connected to one ends of said n vertical charge transfer sections and extending along the horizontal direction, said horizontal charge transfer section receiving said vertical transferred charges from said n vertical charge transfer sections horizontal line by horizontal line as received charges to transfer the received charges along the horizontal direction as horizontal transferred charges;
   at least one power feeding wire which is disposed on and electrically connected to at least said third vertical charge transfer electrode adjacent to said horizontal charge transfer section, which supplies clock pulses to at least said third vertical charge transfer electrode, and which serves as a first shading film for shading said third vertical charge transfer electrode from the incident light;
   a second shading film which is not electrically connected to said one power feeding wire and which shades areas between said photoelectric converting sections adjacent in the vertical direction to each other;
   a third shading film which is not electrically connected to said one power feeding wire and which shades areas between said one power feeding wire and said second shading film, between said one power feeding wire and said horizontal charge transfer section, and over said horizontal charge transfer section; and
   first through fourth vertical bus lines, which are formed outside from said image pickup region, each of said first through fourth vertical bus lines being alternately connected to the first and the second vertical charge transfer electrode via first contact hole while being not connected to the third vertical charge transfer electrode, one of the first through the fourth vertical bus lines being connected to said at least one power feeding wire via second contact hole, the first through the fourth vertical bus lines being supplied with first through fourth clock pulse signals, respectively, which are different in phase from one another, the first through the fourth vertical bus lines supplying the vertical transferring clocks to the first, the second, and the third vertical charge transfer electrodes to make said n vertical charge transfer sections transfer the read charges along the vertical direction as the vertical transferred charges.

6. A solid-state image pickup device as claimed in claim 5, wherein said one power feeding wire is electrically connected to said third vertical charge transfer electrode via third contact hole.

7. A solid-state image pickup device as claimed in claim 5, wherein said one power feeding wire and said second shading film are manufactured in the same manufacturing process as each other.

8. A solid-state image pickup device as claimed in claim 5, wherein said first contact hole and said second contact hole are manufactured in the same manufacturing process as each other.

9. A solid-state image pickup device comprising:

a plurality of photoelectric converting sections, arranged in the configuration of a matrix with m rows and n columns, for accumulating, in response to incident light, electric charges as signal charges where m and n represent first and second positive integers each of which is not less than two;

n vertical charge transfer sections adjacent to the n columns of said photoelectric converting sections at one side thereof, each of said n vertical charge transfer sections extending along a vertical direction, said n vertical charge transfer sections being for reading the signal charges out of said photoelectric converting sections as read charges to transfer the read charges along the vertical direction as vertical transferred charges, each of said n vertical charge transfer sections including m−1 clusters of first and second vertical charge transfer electrodes alternately arranged along the vertical direction, a third vertical charge transfer electrode finally positioned in a vertical charge transfer direction, and a vertical charge transfer region formed beneath the m−1 clusters of first and second vertical charge transfer electrodes and the third vertical charge transfer electrode;

a horizontal charge transfer section connected to one ends of said n vertical charge transfer sections and extending along the horizontal direction, said horizontal charge transfer section receiving said vertical transferred charges from said n vertical charge transfer sections horizontal line by horizontal line as received charges to transfer the received charges along the horizontal direction as horizontal transferred charges;

a power feeding wire which is disposed above and parallel to at least said third vertical charge transfer electrode adjacent to said horizontal charge transfer section and electrically connected to said third vertical charge transfer electrode and which serves as a first shading film for shading said third vertical charge transfer electrode from the incident light.

10. A solid-state image pickup device as claimed in claim 9, further comprising a second shading film which is not electrically connected to said power feeding wire but formed structurally in the same layer as said power feeding wire and which shades not only areas between said photoelectric converting sections adjacent in the vertical direction to each other in an image pickup region but also another areas over said first and said second vertical charge transfer electrodes.

11. A solid-state image pickup device as claimed in claim 10, further comprising a third shading film which is formed structurally in a different layer from said power feeding wire and is not electrically connected to said power feeding wire and which shades areas between said power feeding wire and said second shading film, between said power feeding wire and said horizontal charge transfer section, and over said horizontal charge transfer section.

12. A solid-state image pickup device comprising a plurality of photoelectric converting sections producing electric charges in response to incident light;

a horizontal register extending along a horizontal direction;

at least one vertical register extending along a vertical direction, said vertical register having an end connected to said horizontal register and receiving said electric charges from said photoelectric converting sections;

a plurality of horizontal charge transfer electrodes on said vertical register and extending along said horizontal direction; and a power feeding wire electrically connected to one of said horizontal charge transfer electrodes and being parallel to said one of said horizontal charge transfer electrodes to shade said one of said horizontal charge transfer electrodes from said incident light.

13. A solid-state image pickup device as claimed in claim 12, wherein said one of said horizontal charge transfer electrodes is the nearest electrode to said horizontal register.

* * * * *

UNITED STATES PATENT AND TRADEMARK OFFICE
CERTIFICATE OF CORRECTION

PATENT NO. : 5,912,482
DATED : June 15, 1999
INVENTOR(S) : Morimoto

It is certified that error appears in the above-identified patent and that said Letters Patent is hereby corrected as shown below:

Claim 1, Col. 19, line 6, after "and" insert - -n- -.

Signed and Sealed this

Twenty-fifth Day of January, 2000

Attest:

Attesting Officer

*Acting Commissioner of Patents and Trademarks*